US012046636B2

(12) United States Patent
More

(10) Patent No.: US 12,046,636 B2
(45) Date of Patent: Jul. 23, 2024

(54) DEVICE WITH EPITAXIAL SOURCE/DRAIN REGION

(71) Applicant: Taiwan Semiconductor Manufacturing Company, Ltd., Hsinchu (TW)

(72) Inventor: Shahaji B. More, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/880,839

(22) Filed: Aug. 4, 2022

(65) Prior Publication Data

US 2022/0393000 A1  Dec. 8, 2022

Related U.S. Application Data

(62) Division of application No. 17/168,002, filed on Feb. 4, 2021, now Pat. No. 11,664,424.

(Continued)

(51) Int. Cl.
*H01L 29/08* (2006.01)
*H01L 21/8234* (2006.01)
(Continued)

(52) U.S. Cl.
CPC .. *H01L 29/0847* (2013.01); *H01L 21/823418* (2013.01); *H01L 21/823431* (2013.01);
(Continued)

(58) Field of Classification Search
CPC ............ H01L 29/7851; H01L 29/7848; H01L 21/823418; H01L 29/165;
(Continued)

(56) References Cited

U.S. PATENT DOCUMENTS 10,686,074 B2 * 6/2020 Tsai ................ H01L 21/823437
2014/0091360 A1   4/2014 Pillarisetty et al.
(Continued)

OTHER PUBLICATIONS

Final Office Action dated Oct. 7, 2022 for U.S. Appl. No. 17/168,002.
(Continued)

*Primary Examiner* — Sonya McCall-Shepard
(74) *Attorney, Agent, or Firm* — Eschweiler & Potashnik, LLC

(57) ABSTRACT

The present disclosure relates an integrated chip. The integrated chip may include a semiconductor substrate having sidewalls that define a plurality of fins. A dielectric material is arranged between the plurality of fins and a gate structure is disposed over the dielectric material and around the plurality of fins. Epitaxial source/drain regions are disposed along opposing sides of the gate structure and respectively include a plurality of source/drain segments disposed on the plurality of fins and a doped epitaxial material disposed onto and between the plurality of source/drain segments. A first source/drain segment of the plurality of source/drain segments laterally extends in opposing directions to different distances past opposing sides of an underlying first fin of the plurality of fins.

20 Claims, 19 Drawing Sheets

Related U.S. Application Data

(60) Provisional application No. 63/085,727, filed on Sep. 30, 2020.

(51) Int. Cl.
*H01L 27/088* (2006.01)
*H01L 29/66* (2006.01)
*H01L 29/78* (2006.01)

(52) U.S. Cl.
CPC ...... *H01L 27/0886* (2013.01); *H01L 29/6656* (2013.01); *H01L 29/66795* (2013.01); *H01L 29/785* (2013.01); *H01L 2029/7858* (2013.01)

(58) Field of Classification Search
CPC ......... H01L 21/823431; H01L 27/0886; H01L 29/0847; H01L 29/41791; H01L 29/66795; H01L 29/785; H01L 29/6656; H01L 29/41783; H01L 29/167; H01L 2029/7858; H01L 21/823425; H01L 29/66553; H01L 29/0653; H01L 21/845; H01L 27/1211; H01L 21/823821; H01L 21/823468; H01L 21/823864
See application file for complete search history.

(56) References Cited

U.S. PATENT DOCUMENTS

| | | |
|---|---|---|
| 2016/0005868 A1 | 1/2016 | Wei et al. |
| 2016/0093705 A1* | 3/2016 | Lee .................. H01L 21/31111 257/384 |
| 2016/0315172 A1 | 10/2016 | Wu et al. |
| 2017/0098648 A1* | 4/2017 | Lee ................. H01L 21/823468 |
| 2017/0207126 A1* | 7/2017 | Ching ............... H01L 21/31111 |
| 2018/0158930 A1 | 6/2018 | Liao et al. |
| 2018/0226504 A1 | 8/2018 | Ching et al. |
| 2019/0006363 A1 | 1/2019 | Lin et al. |
| 2019/0164846 A1 | 5/2019 | Leib et al. |
| 2019/0288065 A1 | 9/2019 | Cho et al. |
| 2019/0393096 A1* | 12/2019 | Tang ............... H01L 21/823437 |
| 2020/0006505 A1 | 1/2020 | Lu et al. |
| 2020/0020773 A1 | 1/2020 | Choi et al. |
| 2020/0168735 A1 | 5/2020 | Yu et al. |
| 2021/0242309 A1 | 8/2021 | Hsieh et al. |

OTHER PUBLICATIONS

U.S. Appl. No. 17/033,479, filed Sep. 25, 2020.
Non-Final Office Action dated Jun. 20, 2022 for U.S. Appl. No. 17/168,002.

* cited by examiner

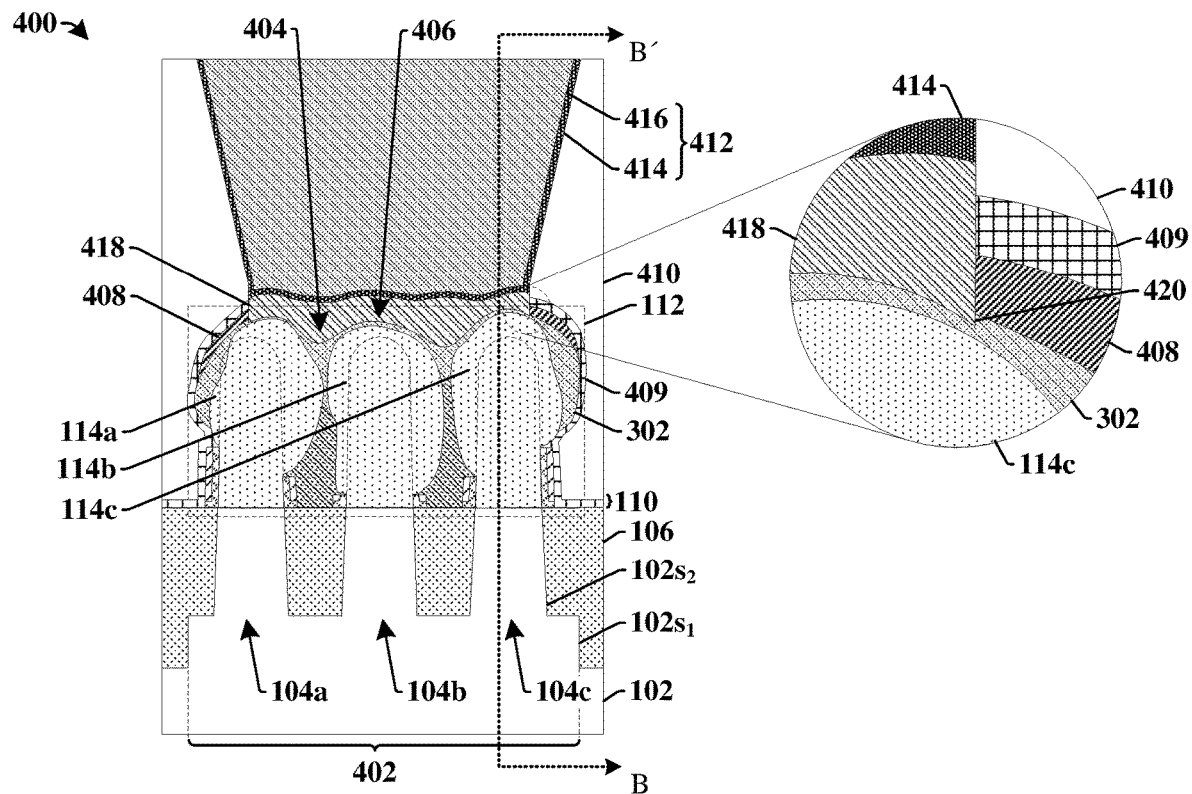
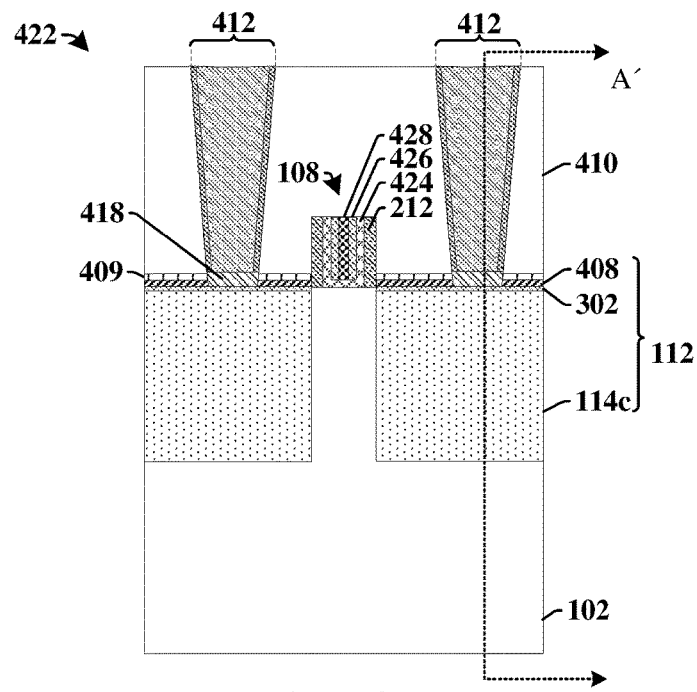
Fig. 4A
Fig. 4B

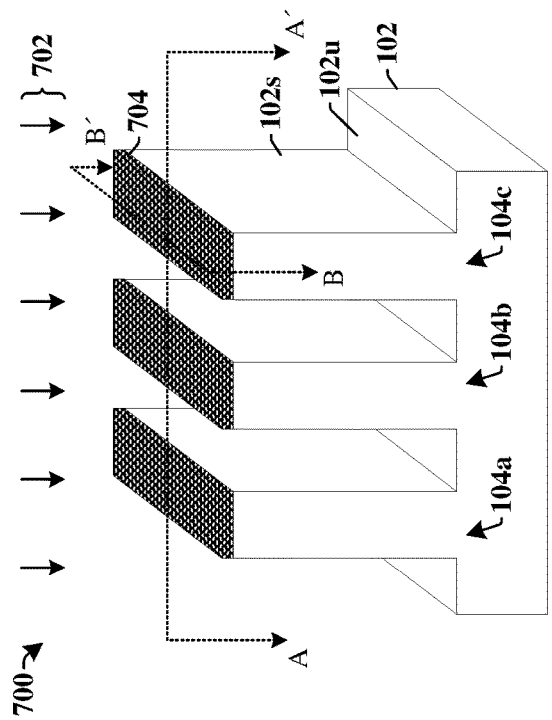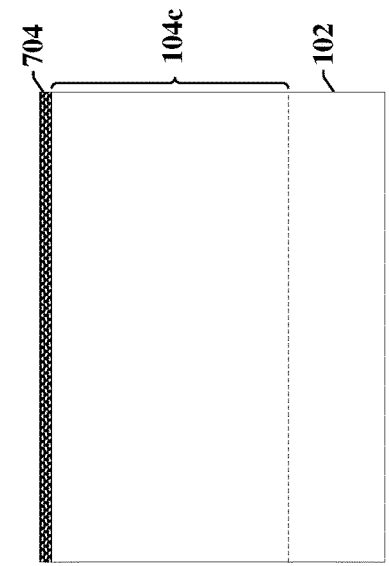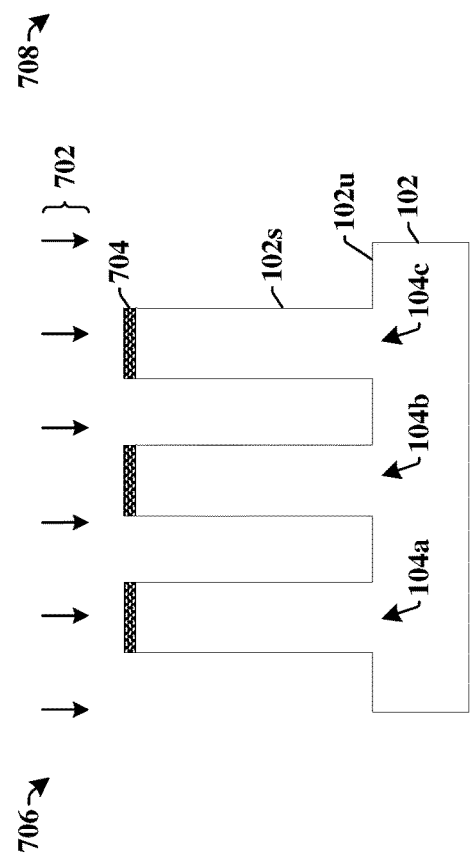

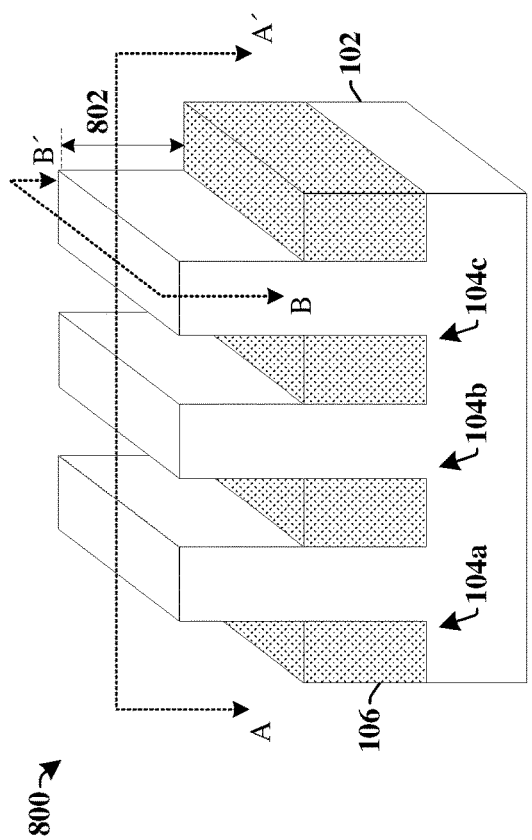
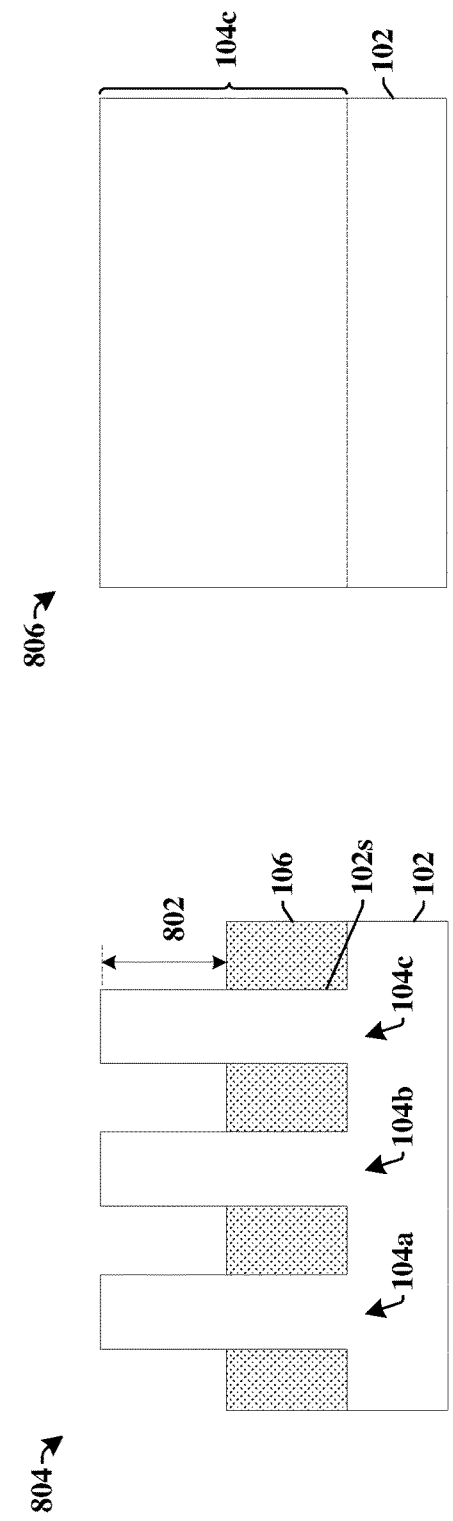
Fig. 8A
Fig. 8B
Fig. 8C

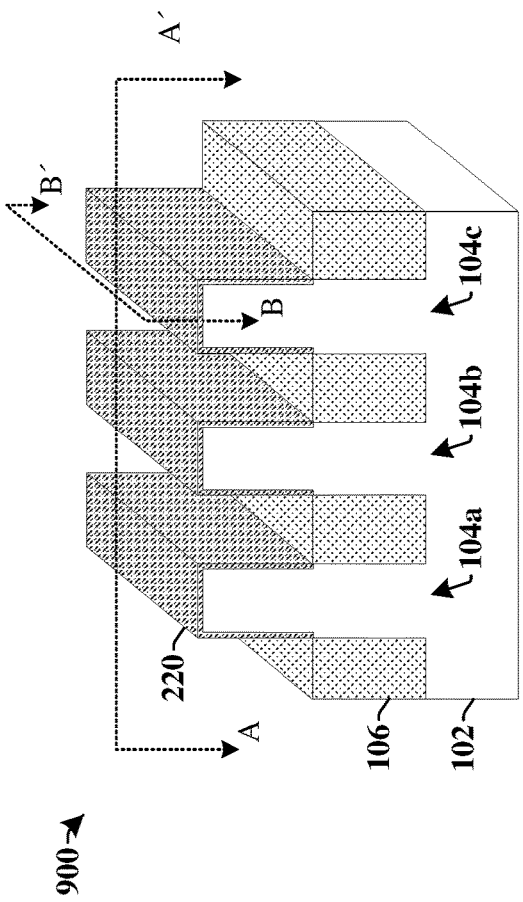
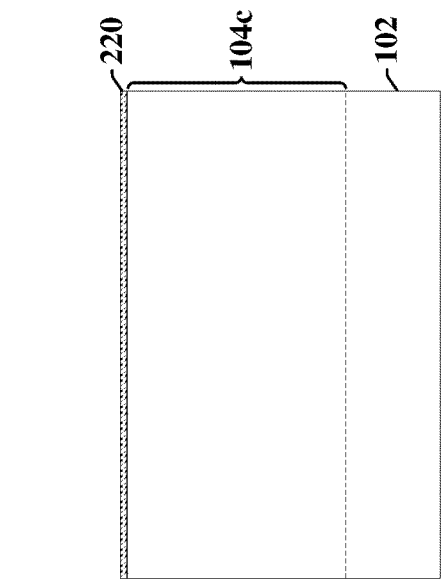
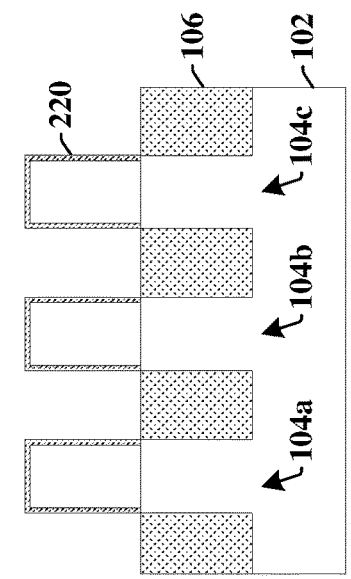
Fig. 9A
Fig. 9B
Fig. 9C

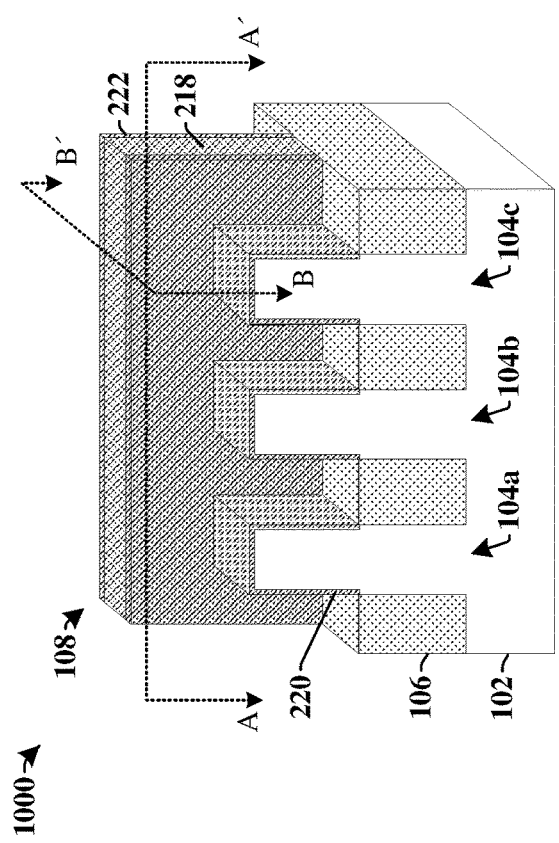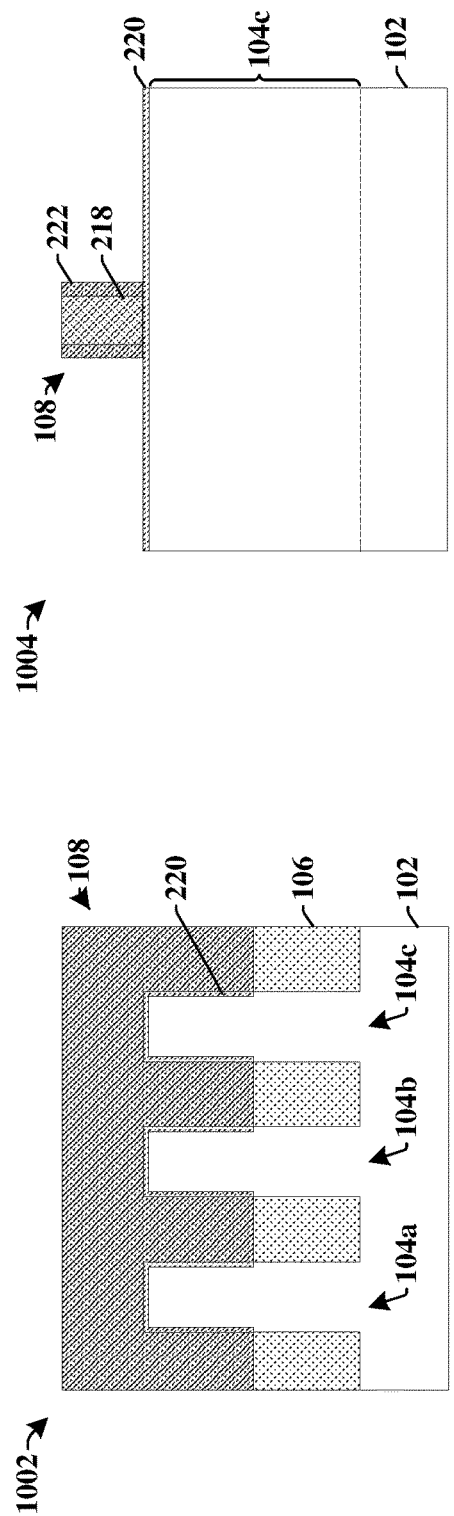
Fig. 10A
Fig. 10B
Fig. 10C

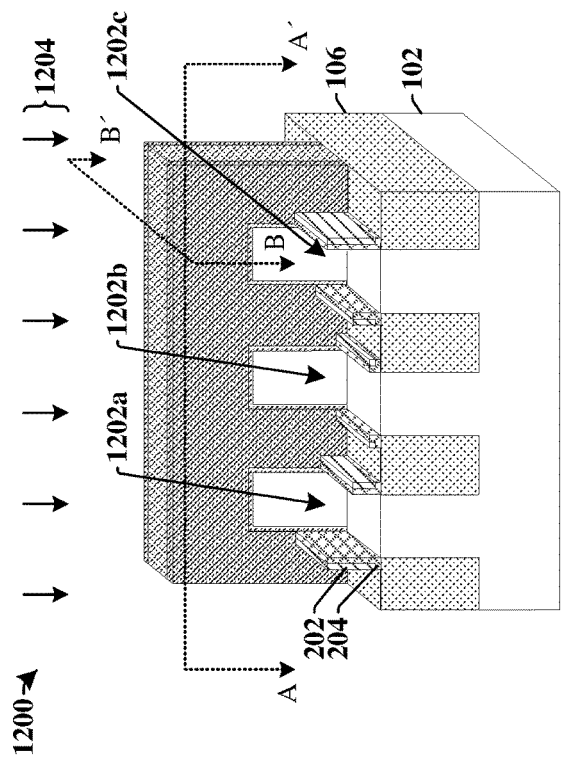
Fig. 12A
Fig. 12B
Fig. 12C

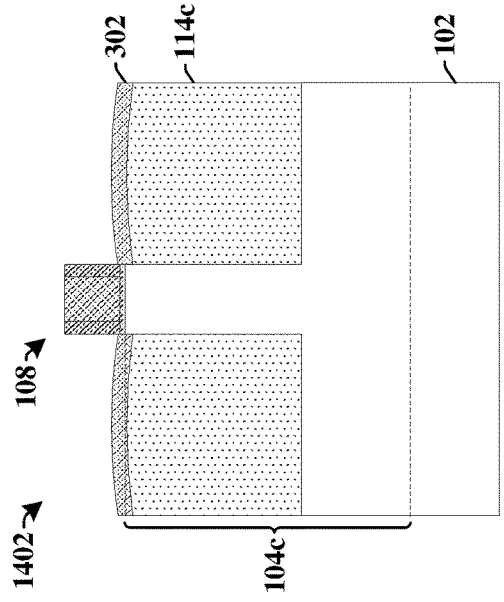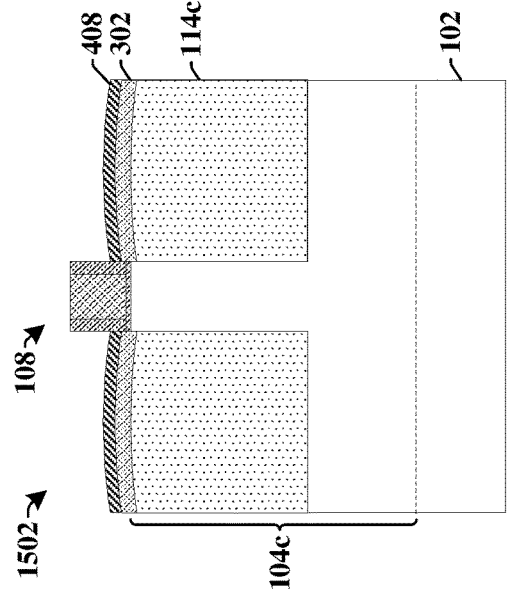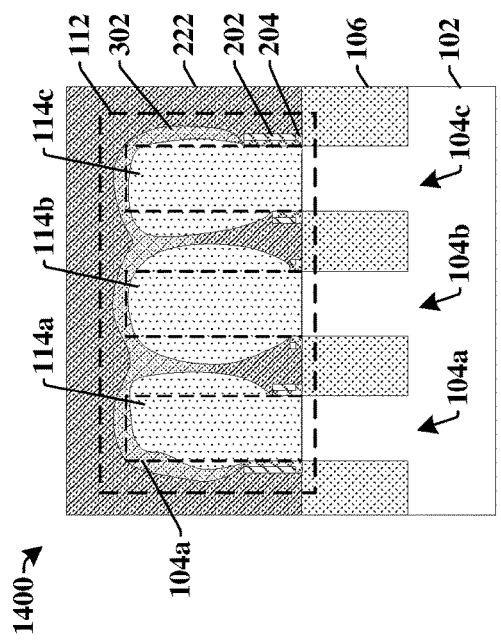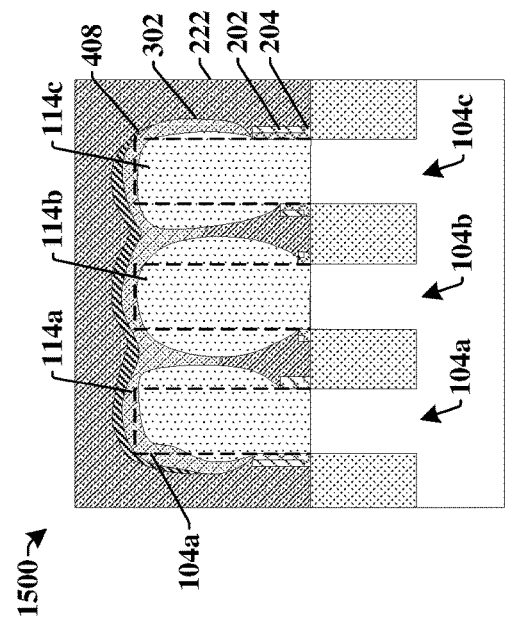

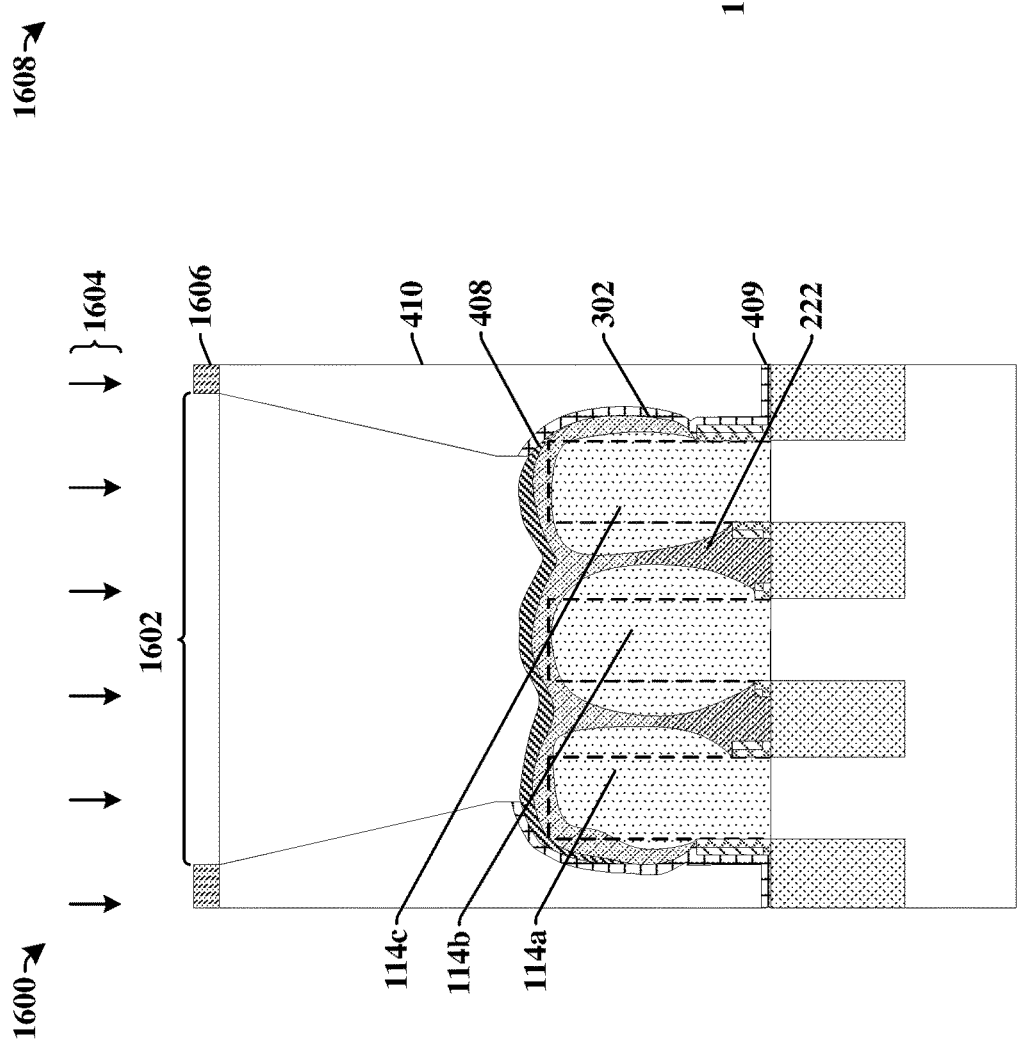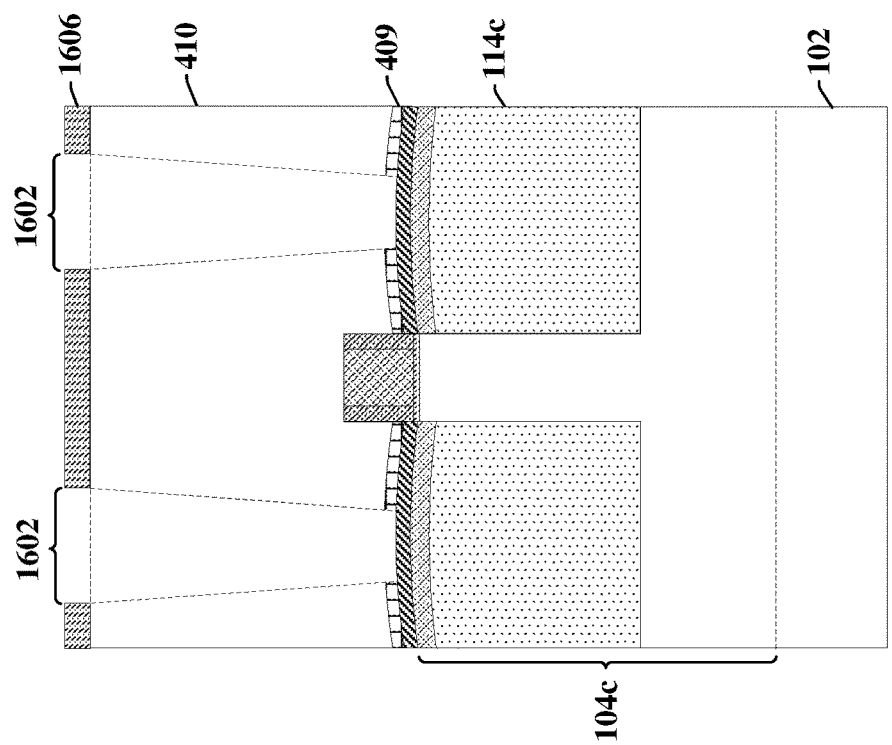
Fig. 16A
Fig. 16B

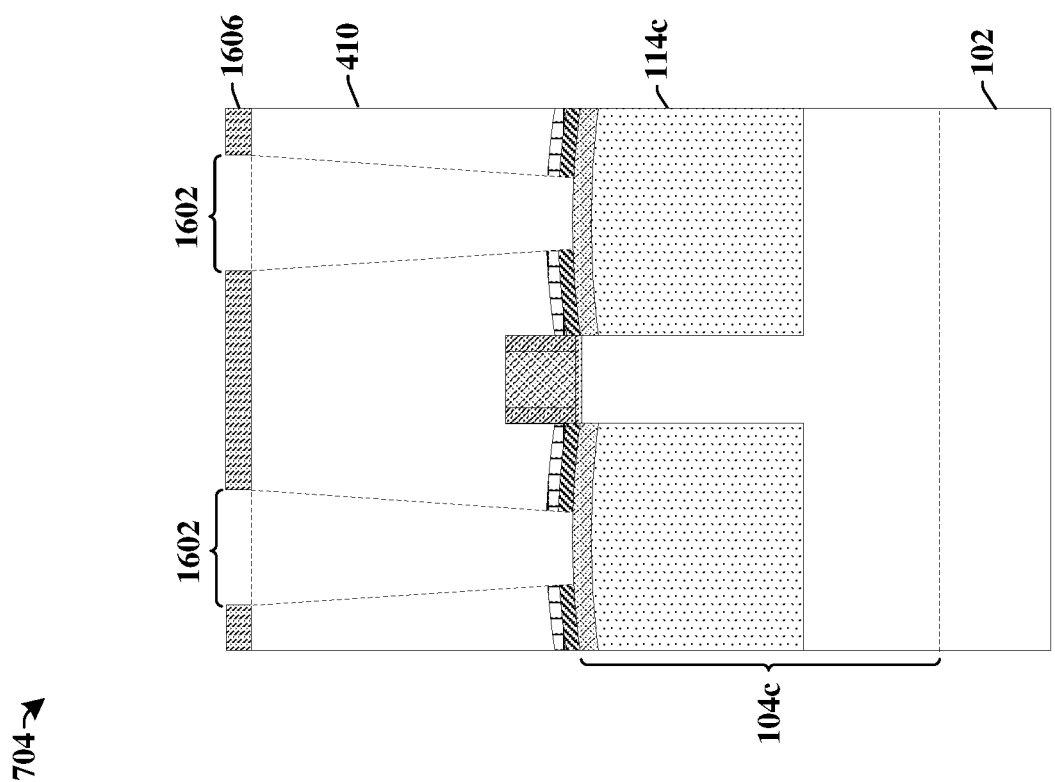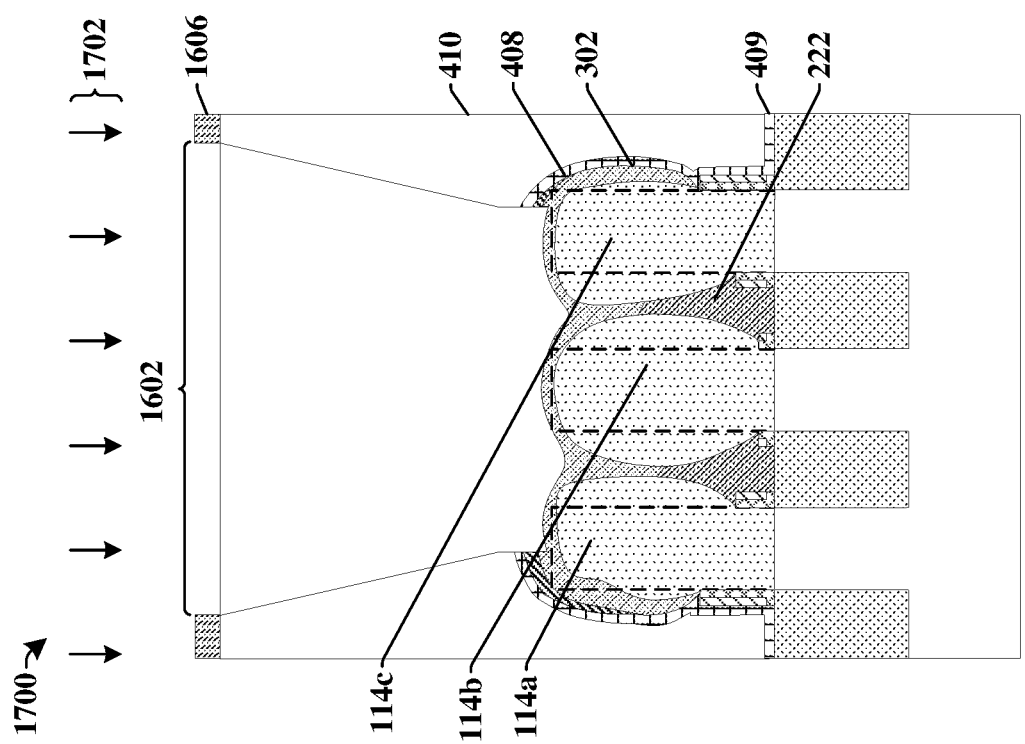

DEVICE WITH EPITAXIAL SOURCE/DRAIN REGION

REFERENCE TO RELATED APPLICATIONS

This application is a Divisional of U.S. application Ser. No. 17/168,002, filed on Feb. 4, 2021, which claims the benefit of U.S. Provisional Application No. 63/085,727, filed on Sep. 30, 2020. The contents of the above-referenced patent applications are hereby incorporated by reference in their entirety.

BACKGROUND

As integrated chips continue to decrease in size, limitations in processing capabilities and in fundamental material characteristics have made scaling of planar transistors increasingly difficult (e.g., due to leakage current and process variations). In recent years, FinFET (Fin Field effect transistors) devices have become a commonly used alternative to planar transistors in emerging technologies (e.g., 22 nm and below). FinFET devices offer a number of advantages over planar transistors, such as faster switching times, lower power consumption, and higher current density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4B illustrate cross-sectional views of some additional embodiments of an integrated chip having a FinFET device comprising a fin spacer.

FIGS. 7A-7C illustrate a three-dimensional view and associated cross-sectional views corresponding to some embodiments of a method of forming an integrated chip having a FinFET device comprising a fin spacer configured to control formation of epitaxial source/drain regions.

FIGS. 8A-8C illustrate a three-dimensional view and associated cross-sectional views corresponding to some embodiments of a method of forming an integrated chip having a FinFET device comprising a disclosed fin spacer.

FIGS. 9A-9C illustrate a three-dimensional view and associated cross-sectional views corresponding to some embodiments of a method of forming an integrated chip having a FinFET device comprising a disclosed fin spacer.

FIGS. 10A-10C illustrate a three-dimensional view and associated cross-sectional views corresponding to some embodiments of a method of forming an integrated chip having a FinFET device comprising a disclosed fin spacer.

FIGS. 12A-12C illustrate a three-dimensional view and associated cross-sectional views corresponding to some embodiments of a method of forming an integrated chip having a FinFET device comprising a disclosed fin spacer.

FIGS. 14A-14B illustrate cross-sectional views corresponding to some embodiments of a method of forming an integrated chip having a FinFET device comprising a disclosed fin spacer.

FIGS. 15A-15B illustrate cross-sectional views corresponding to some embodiments of a method of forming an integrated chip having a FinFET device comprising a disclosed fin spacer.

FIGS. 16A-16B illustrate cross-sectional views corresponding to some embodiments of a method of forming an integrated chip having a FinFET device comprising a disclosed fin spacer.

FIGS. 17A-17B illustrate cross-sectional views corresponding to some embodiments of a method of forming an integrated chip having a FinFET device comprising a disclosed fin spacer.

DETAILED DESCRIPTION

Figure 1A:
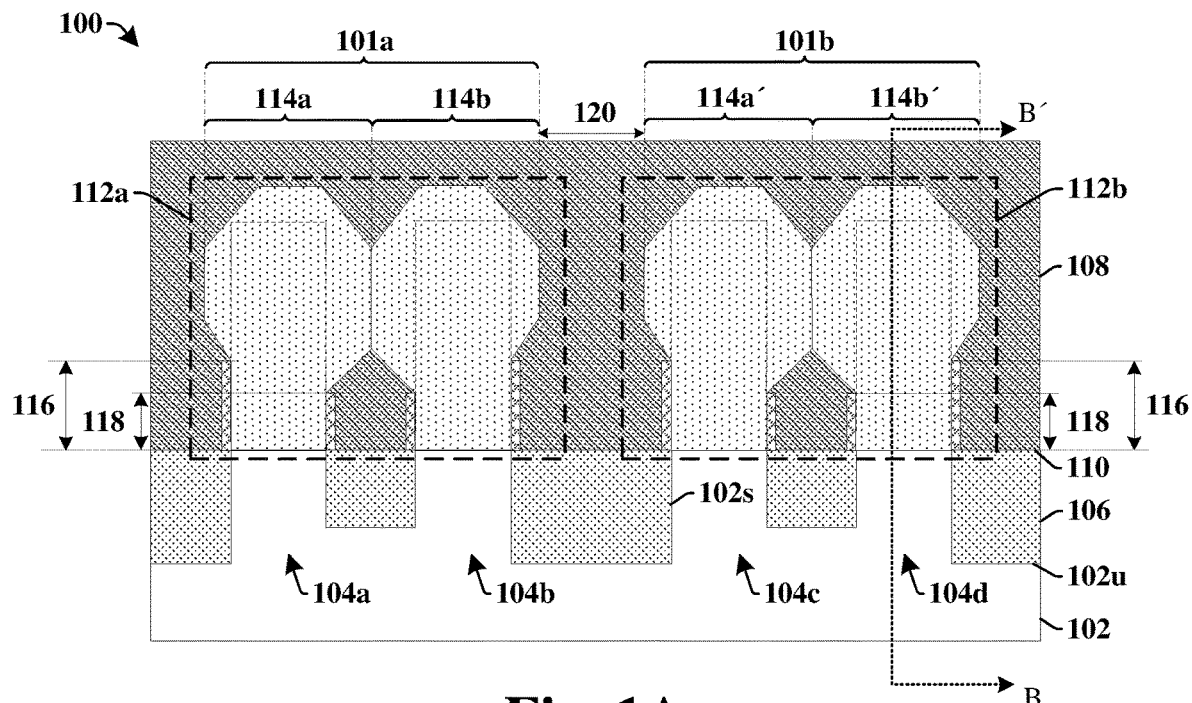
FIGS. 1A-1B illustrate some embodiments of an integrated chip having fin field-effect transistor (FinFET) devices comprising a liner structure configured to control formation of epitaxial source/drain regions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin field-effect transistor (FinFET) devices are three-dimensional structures that comprise a fin of semiconducting material that rises above a planar substrate as a three-dimensional structure. FinFET devices comprise a gate structure that is arranged over the fin of semiconductor material between source/drain regions. The gate structure wraps around the fin of semiconducting material to control a flow of charge carriers within a conducting channel in the fin of semiconducting material. For example, in a tri-gate FinFET structure, a gate structure wraps around three sides of a fin of semiconducting material, thereby forming a conductive channel that extends along three sides of the fin.

To improve performance of a FinFET device, the source/drain regions of the FinFET device may be formed epitaxially rather than by implanting dopants. For example, forming the epitaxial source/drain regions out of a material that introduces a strain on the fin of semiconducting material can increase a mobility of charge carriers within a corresponding conductive channel. In some embodiments, epitaxial source/drain regions may be formed by a process that removes parts of a semiconductor fin that are outside of a gate structure to define source/drain recesses, and subsequently grows epitaxial source/drain regions in the source/drain recesses to replace the removed part of the semiconductor fin. However, it has been appreciated that during formation, the epitaxial source/drain regions will grow both vertically and laterally. As a size of FinFET devices decreases, a distance between adjacent devices also decreases. Due to the lateral growth of the epitaxial source/drain regions, the epitaxial source/drain regions of adjacent FinFET devices may merge resulting in unwanted shorting between the adjacent devices.

In some embodiments, the present disclosure relates to an integrated chip having a fin spacer that is configured to prevent the merger between epitaxial source/drain regions of adjacent FinFET devices by controlling a lateral growth of the epitaxial source/drain regions. The integrated chip comprises a semiconductor substrate having sidewalls that define a plurality of fins. A gate structure is disposed over and along sidewalls of the plurality of fins. Epitaxial source/drain regions are disposed along opposing sides of the gate structure. The epitaxial source/drain regions comprise a plurality of source/drain segments respectively disposed over one of the plurality of fins. A fin spacer is arranged along sidewalls of the plurality of source/drain segments. The fin spacer comprises a first sidewall having a first height along a first side of a first source/drain segment of the plurality of source/drain segments and a second sidewall having a second height along an opposing second side of the first source/drain segment. Since a height of a sidewall of the fin spacer is inversely related to a lateral growth the epitaxial source/drain regions past the sidewalls, a lateral growth of the epitaxial source/drain regions can be controlled by the fin spacer. By controlling a lateral growth of the epitaxial source/drain regions, merger between adjacent FinFET devices may be mitigated.

Figure 1B:
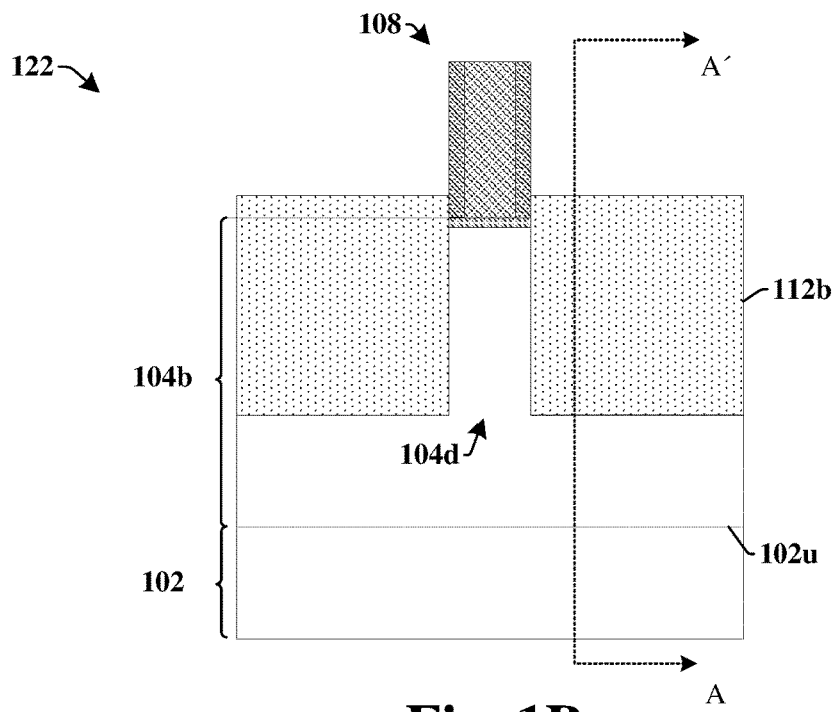

FIGS. 1A-1B illustrate cross-sectional views, 100 and 122, of some embodiments of an integrated chip comprising a fin spacer configured to control a lateral growth of epitaxial source/drain regions of a FinFET devices. Cross-sectional view 100 of FIG. 1A is taken along cross-sectional line A-A' of FIG. 1B, while cross-sectional view 122 of FIG. 1B is taken along cross-sectional line B-B' of FIG. 1A.

The integrated chip comprises a substrate 102 having sidewalls 102s defining a first plurality of fins 104a-104b and a second plurality of fins 104c-104d. The first plurality of fins 104a-104b and the second plurality of fins 104c-104d respectively protrude outward from an upper surface 102u of the substrate 102. A dielectric material 106 is disposed along opposing sides of the first plurality of fins 104a-104b and the second plurality of fins 104c-104d. The dielectric material 106 laterally separates the first plurality of fins 104a-104b and the second plurality of fins 104c-104d from one another.

A gate structure 108 extends over the first plurality of fins 104a-104b and the second plurality of fins 104c-104d. The gate structure 108 wraps around sides and upper surfaces of the first plurality of fins 104a-104b and the second plurality of fins 104c-104d. First epitaxial source/drain regions 112a are disposed along opposing sides of the gate structure 108 over the first plurality of fins 104a-104b to define a first multi-fin transistor device 101a. Second epitaxial source/drain regions 112b are disposed along opposing sides of the gate structure 108 over the second plurality of fins 104c-104d to define a second multi-fin transistor device 101b. In some embodiments, the second epitaxial source/drain regions 112b are laterally separated from the first epitaxial source/drain regions 112a by way of a non-zero distance 120. In some embodiments, the first multi-fin transistor device 101a and the second multi-fin transistor device 101b may be NMOS (negative-channel metal-oxide semiconductor) devices.

The first epitaxial source/drain regions 112a comprise a plurality of source/drain segments 114a-114b respectively disposed over one of the first plurality of fins 104a-104b. For example, the first epitaxial source/drain regions 112a may comprise a first source/drain segment 114a disposed over a first fin 104a and a second source/drain segment 114b disposed over a second fin 104b. The second epitaxial source/drain regions 112b comprise a plurality of source/drain segments 114a'-114b' respectively disposed over one of the second plurality of fins 104c-104d. For example, the second epitaxial source/drain regions 112b may comprise a third source/drain segment 114a' disposed over a third fin 104c and a fourth source/drain segment 114b' disposed over a fourth fin 104d.

A fin spacer 110 is disposed over the dielectric material 106 and along sidewalls of the plurality of source/drain segments 114a-114b and 114a'-114b'. The fin spacer 110 extends to different heights along sidewalls of different ones of the plurality of source/drain segments 114a-114b and 114a'-114b'. In some embodiments, the fin spacer 110 extends to a greater height along sidewalls of the plurality of source/drain segments 114a-114b and 114a'-114b' that are along an outer sidewalls of an epitaxial source/drain region (e.g., sidewalls that face away from the epitaxial source/drain region) than along interior sidewalls of the epitaxial source/drain region (e.g., sidewalls that face away towards the epitaxial source/drain region). For example, in some embodiments the fin spacer 110 may extend to a first height 116 along an outer sidewall of the first epitaxial source/drain region 112a and to a second height 118, which is smaller than the first height 116, along an interior sidewall of the first epitaxial source/drain region 112a.

The fin spacer 110 is configured to control a lateral growth of the source/drain segments 114a-114b and 114a'-114b', so that the source/drain segments 114a-114b and 114a'-114b' extend to different lateral distances past an underlying sidewall of the fin spacer 110 (and past an underlying one of the plurality of fins 104a-104c) depending on a height of the underlying sidewall. In some embodiments, a larger a height of the underlying sidewall of the fin spacer 110, the smaller the lateral extension of an associated epitaxial source/drain segment past the sidewall. By using the fin spacer 110 to control a lateral growth of the plurality of source/drain segments 114a-114b and 114a'-114b', a lateral merger between the first epitaxial source/drain regions 112a and the second epitaxial source/drain regions 112b can be mitigated.

Figure 2A:
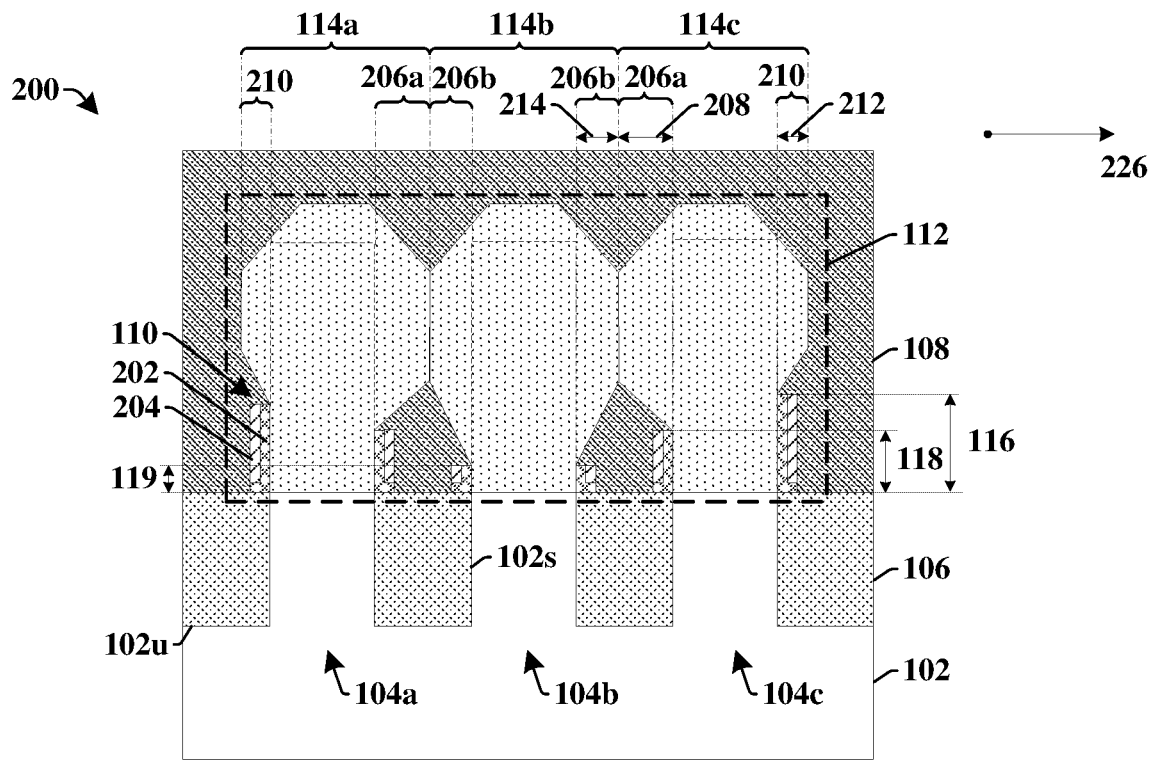
FIGS. 2A-2C illustrate some additional embodiments of an integrated chip having a FinFET device comprising a fin spacer configured to control formation of epitaxial source/drain regions.
Figure 2B:
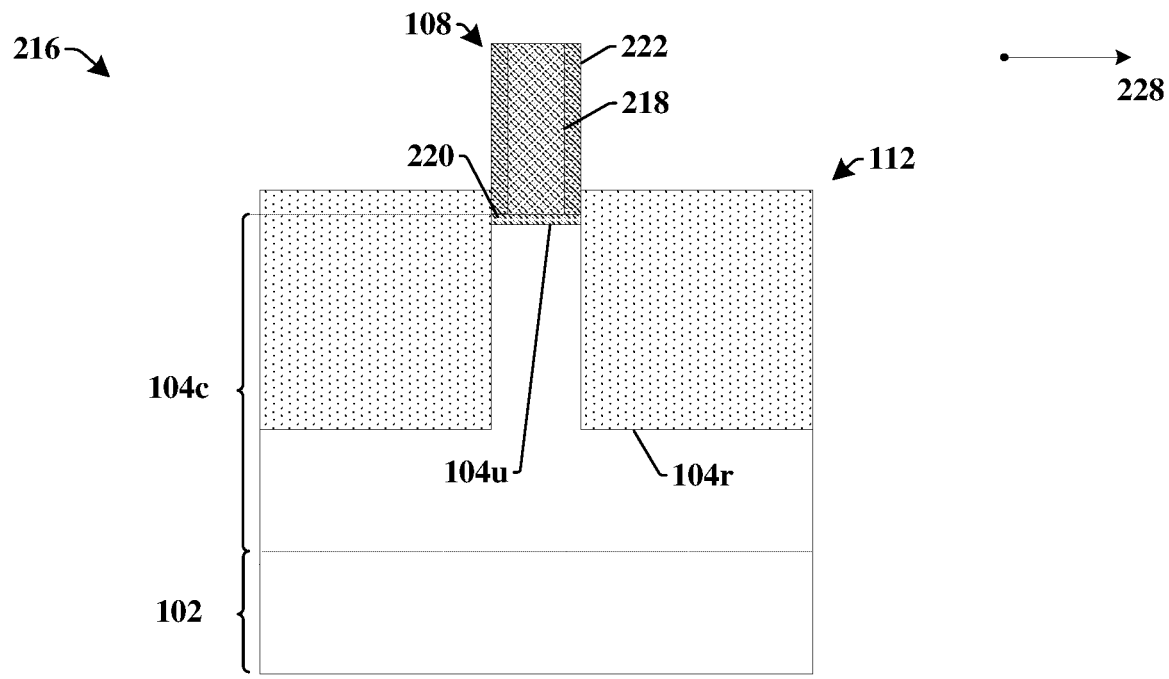
Figure 2C:
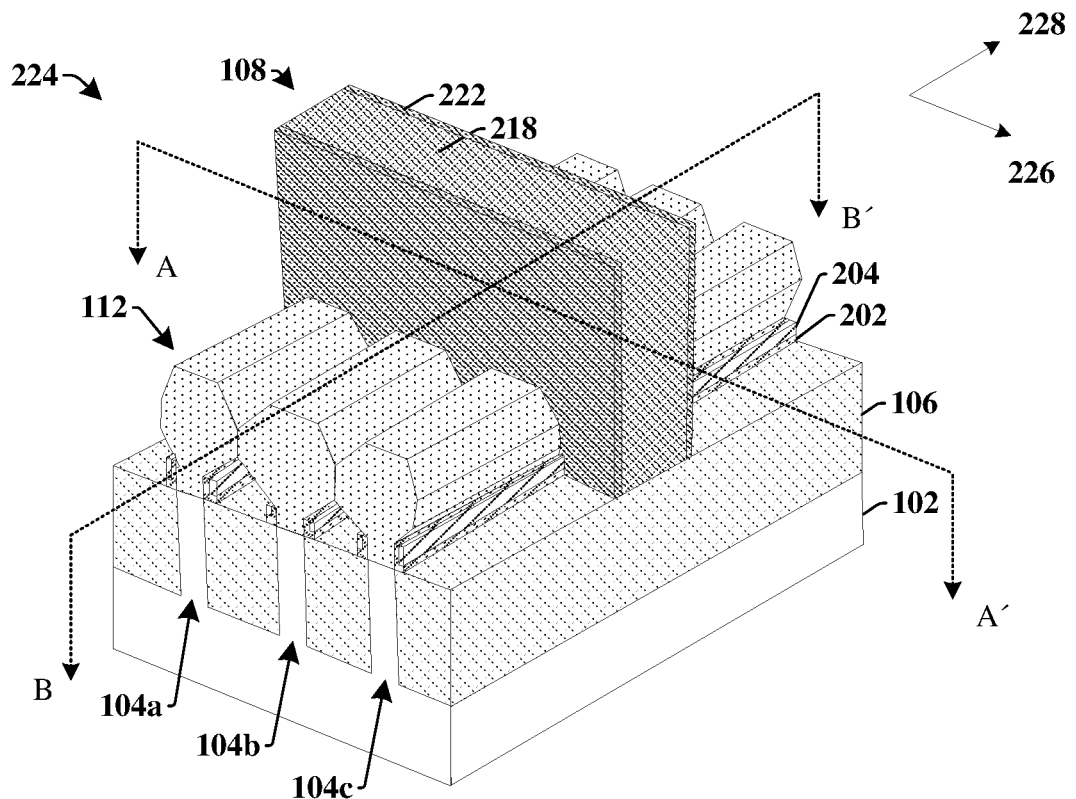

FIGS. 2A-2C some additional embodiments of an integrated chip comprising a FinFET device having a fin spacer configured to control formation of epitaxial source/drain regions.

As shown in cross-sectional view 200 of FIG. 2A (taken along cross-sectional line A-A' in three-dimensional view 224 of FIG. 2C), the integrated chip comprises a substrate 102 having sidewalls 102s defining a plurality of fins 104a-104c that protrude outward from an upper surface 102u of the substrate 102. In some embodiments, the plurality of fins 104a-104c may comprise three fins. In other embodiments (not shown), the plurality of fins 104a-104c may comprise more fins (e.g., 4 fins, 5 fins, etc.) or less fins (e.g., 2 fins). A dielectric material 106 is disposed along opposing sides of the plurality of fins 104a-104c. As shown in three-dimensional view 224 of FIG. 2C, the plurality of fins 104a-104c are laterally separated from one another along a first direction 226 by the dielectric material 106 and extend along a second direction 228 that is perpendicular to the first direction 226.

A gate structure 108 is disposed over the plurality of fins 104a-104c. The gate structure 108 wraps around sides and an upper surface of the plurality of fins 104a-104c. As shown in cross-sectional view 216 of FIG. 2B (taken along cross-sectional line B-B' in three-dimensional view 224 of FIG. 2C), the gate structure 108 comprises a conductive gate electrode 218 that is separated from a third fin 104c by a gate dielectric 220 and that is laterally surrounded by sidewall spacers 222. In some embodiments, the plurality of fins 104a-104c may be recessed outside of the gate structure 108. In such embodiments, the plurality of fins 104a-104c comprise a recessed surface 104r that is below an uppermost surface 104u of the plurality of fins 104a-104c. Epitaxial source/drain regions 112 are disposed over the recessed surface 104r and along opposing sides of the gate structure 108. As shown in cross-sectional view 200 of FIG. 2A, the epitaxial source/drain regions 112 comprise a plurality of source/drain segments 114a-114b respectively disposed over one of the plurality of fins 104a-104c. For example, a first source/drain segment 114a is disposed over a first fin 104a, a second source/drain segment 114b is disposed over a second fin 104b, etc.

A fin spacer 110 is disposed over the dielectric material 106 and along sidewalls of the plurality of source/drain segments 114a-114c. The fin spacer 110 extends to different heights along different sidewalls of the plurality of source/drain segments 114a-114c. In some embodiments, the fin spacer 110 extends to a greater height along outer sidewalls of the plurality of source/drain segments 114a-114c (e.g., sidewalls facing away from an adjacent one of the plurality of source/drain segments 114a-114c) than along interior sidewalls of the plurality of source/drain segments 114a-114c (e.g., sidewalls facing towards an adjacent one of the plurality of source/drain segments 114a-114c). For example, in some embodiments, the fin spacer 110 may extend to a first height 116 along an outer sidewall of the plurality of source/drain segments 114a-114c, to a second height 118 along a first interior sidewall of the plurality of source/drain segments 114a-114c, and to a third height 119 along a second interior sidewall of the plurality of source/drain segments 114a-114c. Because the fin spacers 110 mitigate lateral growth of the plurality of source/drain segments 114a-114c, the outer sidewall of the plurality of source/drain segments 114a-114c may extend to the first height 116, the first interior sidewall may extend to the second height 118, and the second interior sidewall may extend to the third height 119. In some such embodiments, the fin spacers 110 may completely cover the outer sidewall, the first interior sidewall, and the second interior sidewall of the plurality of source/drain segments 114a-114c.

The fin spacer 110 is configured to control a lateral growth of the plurality of source/drain segments 114a-114c, so that the plurality of source/drain segments 114a-114c extend to different lateral distances past an underlying one of the plurality of fins 104a-104c depending on height of underlying sidewalls of the fin spacer 110. For example, in some embodiments, the plurality of source/drain segments 114a-114c may comprise a first source/drain segment 114a and a third source/drain segment 114c arranged along opposing sides of a second source/drain segment 114b. The first source/drain segment 114a and the third source/drain segment 114c may respectively comprise an inner region 206a that is between a sidewall of one of the plurality of fins 104a-104c, and a sidewall of an adjacent one of the plurality of fins 104a-104c and an outer region 210 that is arranged along an outermost sidewall of the epitaxial source/drain region 112. The inner region 206a protrudes to a first distance 208 past an underlying fin, while the outer region 210 protrudes to a second distance 212, which is less than the first distance 208, past the underlying fin. In some embodiments, a second source/drain segment 114b may comprise inner regions 206b that protrude to a third distance 214 past the second fin 104b. In some embodiments, the first distance 208 is different than (e.g., greater than) the third distance 214. By using the fin spacer 110 to control the first distance 208, the second distance 212, and the third distance 214, merger of adjacent epitaxial source/drain regions can be mitigated.

Figure 3:
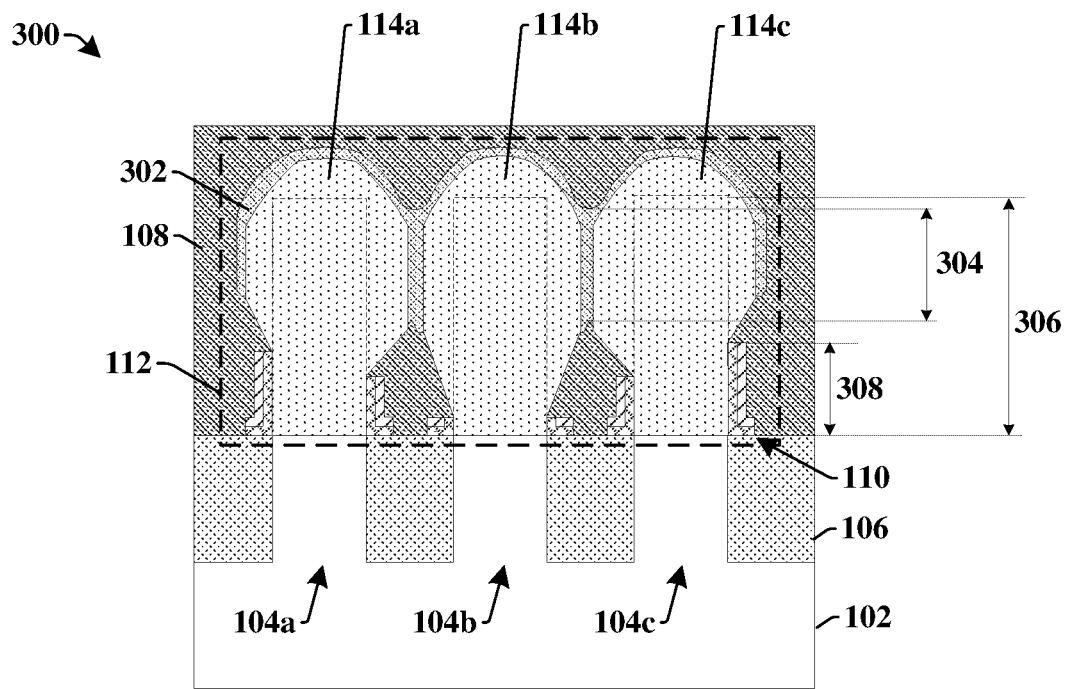
FIG. 3 illustrates a cross-sectional view of some additional embodiments of an integrated chip having a FinFET device comprising a fin spacer.

FIG. 3 illustrates a cross-sectional view of some additional embodiments of an integrated chip 300 having a FinFET device comprising a fin spacer configured to control formation of epitaxial source/drain regions.

The integrated chip 300 comprises epitaxial source/drain regions 112 having a plurality of source/drain segments 114a-114b respectively disposed over a plurality of fins 104a-104c surrounded by a dielectric material 106. In some embodiments, the epitaxial source/drain regions 112 may further comprise a doped epitaxial material 302 arranged on the plurality of source/drain segments 114a-114c. The doped epitaxial material 302 extends over and between adjacent ones of the plurality of source/drain segments 114a-114c. In some embodiments, the doped epitaxial material 302 continuously extends from a sidewall of a first source/drain segment 114a to a sidewall of a second source/drain segment 114b. In some embodiments, the doped epitaxial material 302 directly contacts the plurality of source/drain segments 114a-114c.

In some embodiments, the doped epitaxial material 302 fills in spaces between adjacent ones of the plurality of source/drain segments 114a-114c. In such embodiments, the doped epitaxial material 302 continuously extends directly over and between the plurality of source/drain segments 114a-114c. In some embodiments, the doped epitaxial material 302 between adjacent ones of the plurality of source/ drain segments 114a-114c has a first height 304 that is smaller than a second height 306 of the plurality of fins 104a-104c above the dielectric material 106. For example, in some embodiments, the first height 304 is in a range of between approximately 15% and approximately 40% of the second height 306 of the plurality of fins 104a-104c. In other embodiments, the first height 304 is in a range of between approximately 10% and approximately 50% of the second height 306. The relatively small size of the first height 304 reduces a diffusion of dopants from the doped epitaxial material 302 to the substrate 102 by increasing a distance between the doped epitaxial material 302 and the substrate 102. Reducing a diffusion of dopants into the substrate 102 may improve short channel effects in an associated multi-fin transistor device.

A fin spacer 110 extends along sidewalls of the plurality of source/drain segments 114a-114c. In some embodiments, the fin spacer 110 extends vertically between an upper surface of the dielectric material 106 and the epitaxial source/drain region 112 for a third height 308 that is between approximately 0% and approximately 25% of the second height 306. In other embodiments, the third height 308 may be between approximately 0% and approximately 5% of the second height 306. In some embodiments, the fin spacer 110 may have an outermost sidewall facing away from the plurality of source/drain segments 114a-114c. In some embodiments, the outermost sidewall may be arranged along a protrusion that protrudes outward from an upper sidewall of the fin spacer 110 that faces away from the plurality of source/drain segments 114a-114c. In other embodiments (not shown), the outermost sidewall may extend between bottommost and topmost surfaces of the fin spacer 110.

FIGS. 4A-4B illustrate cross-sectional views of some additional embodiments of an integrated chip having a FinFET device comprising a fin spacer configured to control formation of epitaxial source/drain regions. Cross-sectional view 400 of FIG. 4A is taken along cross-sectional line A-A' of FIG. 4B, while cross-sectional view 422 of FIG. 4B is taken along cross-sectional line B-B' of FIG. 4A.

The integrated chip comprises a substrate 102 having first sidewalls 102s1 defining a crown structure 402 including a plateau of semiconductor material extending outward from an upper surface of the substrate 102. The substrate 102 further comprises second sidewalls 102s2 defining a plurality of fins 104a-104c protruding outward from the crown structure 402. In some embodiments, the plurality of fins 104a-104c may be tapered to have a width that decreases as a distance from the crown structure 402 increases. In some additional embodiments, the plurality of fins 104a-104c may respectively have a rounded upper surface. A dielectric material 106 is disposed over the substrate 102 and around the crown structure 402 and the plurality of fins 104a-104c.

Epitaxial source/drain regions 112 comprise a plurality of source/drain segments 114a-114b respectively disposed over the plurality of fins 104a-104c. A fin spacer 110 is disposed over the dielectric material 106 and along sidewalls of the plurality of source/drain segments 114a-114b. The plurality of source/drain segments 114a-114b extend from directly between sidewalls of the fin spacer 110 to over the fin spacer 110. The epitaxial source/drain regions 112 further comprise a doped epitaxial material 302 arranged on the plurality of source/drain segments 114a-114c. The doped epitaxial material 302 has a higher dopant concentration than that of the plurality of source/drain segments 114a-114c. In some embodiments, the epitaxial source/drain regions 112 may further comprise a cap layer 408 arranged over the doped epitaxial material 302. The cap layer 408 comprises a lower doping concentration than the doped epitaxial material 302 and is configured to prevent out diffusion of dopants from the doped epitaxial material 302 to an overlaying layer (e.g., silicide 418). In some embodiments, the epitaxial source/drain regions 112 may comprise an upper surface that faces away from the substrate 102 and that has a wavy profile defined by troughs 404 and crests 406 within the doped epitaxial material 302. In some embodiments, the crests 406 may be directly over the plurality of source/drain segments 114a-114b and the troughs 404 may be arranged between the plurality of source/drain segments 114a-114b. In some embodiment, the wavy profile may have one or more surfaces with (111) facets.

A gate structure 108 is arranged over the plurality of fins 104a-104c. In some embodiments, the gate structure 108 comprises a metal gate. In some such embodiments, the gate structure 108 comprises a gate dielectric 424 separating one or more gate metals 426-428 from the plurality of fins 104a-104c. In some embodiments, the gate dielectric 424 may comprise a high-κ dielectric layer such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate (Zr-$SiO_2$), etc. In some embodiments, the one or more gate metals may comprise a work function metal 426 and an overlying fill metal 428. In some embodiments, the work function metal 426 may comprise tantalum, titanium, hafnium, zirconium, or the like. In some embodiments, the fill metal 428 may comprise aluminum, copper, or the like.

An etch stop layer 409 is arranged over the fin spacer, and around the gate structure 108. In various embodiments, the etch stop layer 409 may comprise a nitride (e.g., silicon nitride), a carbide (e.g., silicon carbide), or the like. An inter-level dielectric (ILD) layer 410 is disposed over the etch stop layer 409 fin spacer. The ILD layer 410 laterally surrounds the epitaxial source/drain regions 112. In various embodiments, the ILD layer 410 may comprise a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Interconnects 412 extend through the ILD layer 410 to over the epitaxial source/drain regions 112. In some embodiments, the interconnects 412 laterally and continuously extends over the plurality of source/drain segments 114a-114c. In various embodiments, the interconnects 412 may comprise a conductive contact, a middle-end-of-the-line (MEOL) interconnect, or the like. In some embodiments, the interconnects 412 comprise a conductive material 416, such as copper, tungsten, ruthenium, or the like. In some additional embodiments, the interconnects 412 may comprise a liner 414 that separates the conductive material 416 from the ILD layer 410. In various embodiments, the liner 414 may comprise titanium, titanium nitride, tantalum, tantalum nitride, or the like.

In some embodiments, a silicide 418 is arranged on the upper surface of the epitaxial source/drain regions 112. In some embodiments, the silicide 418 laterally and continuously extends over the plurality of source/drain segments 114a-114c. In some embodiments, the silicide 418 may extend into the troughs 404 and over the crests 406 defining the wavy profile of the upper surfaces of the epitaxial source/drain regions 112. Having the silicide 418 extend into the troughs 404 and over the crests 406 defining the wavy profile reduces a resistance between the silicide 418 and the doped epitaxial material 302 by increasing a surface area of a connection between the silicide 418 and doped epitaxial material 302. In some embodiments, the silicide 418 may also have an upper surface that has a second wavy profile. In such embodiments, the interconnects 412 may extend into troughs and over crests of the second wavy profile to improve an electrical contact between the silicide 418 and the interconnects 412. In some embodiments, the doped epitaxial material 302 may have a vertically extending sidewall 420 that extends along a sidewall of the silicide 418. The vertically extending sidewall 420 is a result of an etch used to expose the doped epitaxial material 302 during fabrication.

Figure 5A:
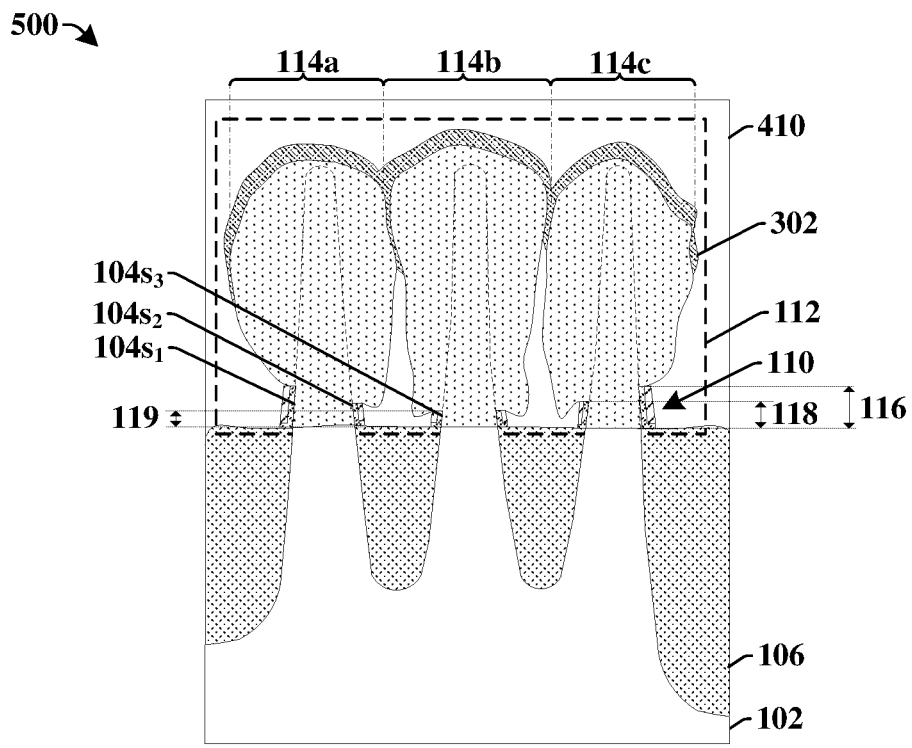
FIGS. 5A-5B illustrate cross-sectional views of some additional embodiments of integrated chips having a FinFET device comprising a fin spacer.
Figure 5B:
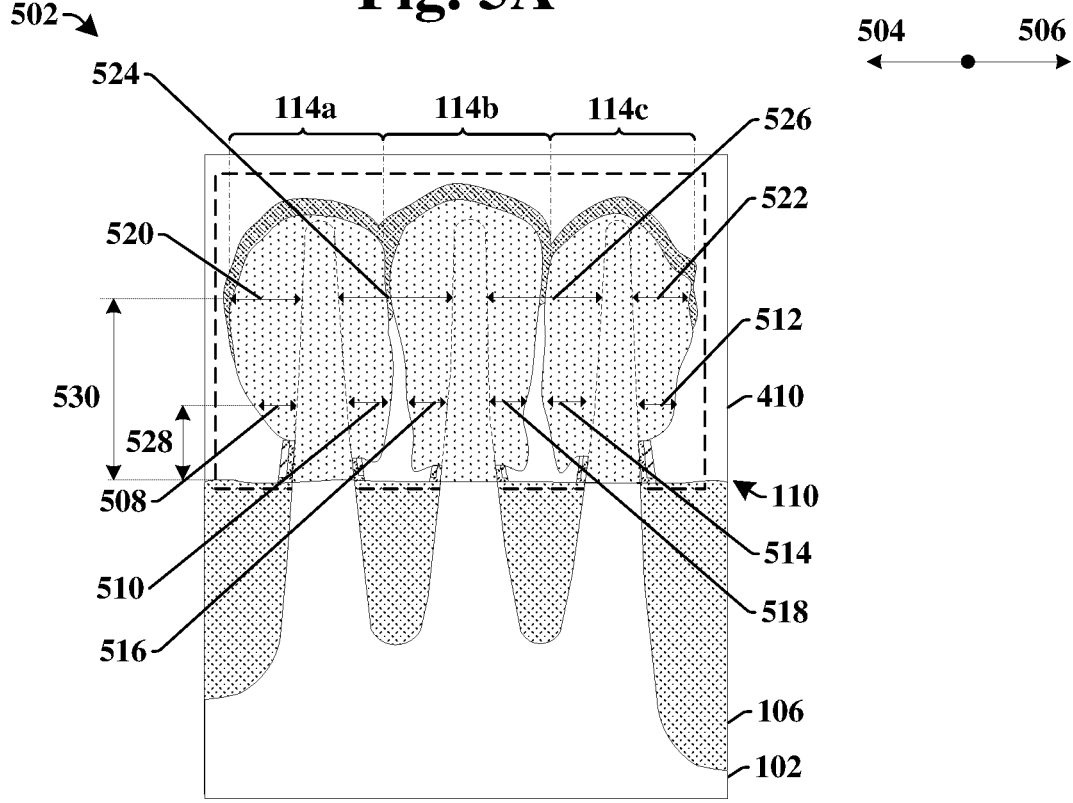

FIGS. 5A-5B illustrate cross-sectional views, 500 and 502, of some additional embodiments of integrated chips having a FinFET device comprising a fin spacer configured to control formation of epitaxial source/drain regions.

As shown in cross-sectional view 500 of FIG. 5A, the integrated chip comprises a FinFET device having epitaxial source/drain regions 112 that continuously extend over a plurality of fins 104a-104c. The epitaxial source/drain regions 112 comprise a plurality of source/drain segments 114a-114c. In some embodiments, the plurality of source/drain segments 114a-114b comprise a first source/drain segment 114a disposed over a first fin 104a, a second source/drain segment 114b disposed over a second fin 104b, and a third source/drain segment 114c disposed over a third fin 104c. The first source/drain segment 114a and the third source/drain segment 114c (e.g., the outer source/drain segments) laterally surround the second source/drain segment 114b (e.g., the central source/drain segment).

A fin spacer 110 is arranged along sidewalls of the plurality of source/drain segments 114a-114b. In some embodiments, the first source/drain segment 114a and the third source/drain segment 114c (e.g., the outer source/drain segments) may respectively have an exterior sidewall 104s1 that faces away from the second fin 104b and that is covered by the fin spacer 110 and an interior sidewall 104s2 that faces the second fin 104b and that is covered by the and fin spacer 110. The exterior sidewall 104s1 and the interior sidewall 104s2 extend to different heights. For example, the exterior sidewall 104s1 may extend to a greater height than the interior sidewall 104s2. In some embodiments, the exterior sidewall $104s_1$ extends to a first height 116 that is in a range of between approximately 5 nm and approximately 10 nm, between approximately 7 nm and approximately 15 nm, or other similar values. In some embodiments, the interior sidewall 104s2 extends to a second height 118 that is in a range of between approximately 2 nm and approximately 6 nm, between approximately 3 nm and approximately 8 nm, or other similar values.

In some embodiments, the second source/drain segment 114b (e.g., the central source/drain segment) may have opposing interior sidewalls 104s3 that are covered by the fin spacer 110. The interior sidewalls 104s3 may have approximately equal heights. In some embodiments, the interior sidewalls 104s3 of the second fin 104b may extend to a third height 119 that is in a range of between approximately 0.1 nm and approximately 2 nm, between approximately 0.05 nm and approximately 5 nm, or other similar values.

As shown in cross-sectional view 502 of FIG. 5B, in some embodiments the first source/drain segment 114a may be asymmetric in relation to the first fin 104a and the third source/drain segment 114c may be asymmetric in relation to the third fin 104c. In some embodiments, the first source/drain segment 114a may laterally extend past the first fin 104a in opposing directions to different distances and the third source/drain segment 114c may laterally extend past the third fin 104c in opposing directions to different distances. For example, in some embodiments, the first source/drain segment 114a may laterally extend in a first direction 504 past the first fin 104a to a first distance 508 at a first height 528 and in a second direction 506 past the first fin 104a to a second distance 510 at the first height 528. Similarly, the third source/drain segment 114c may laterally extend in the second direction 506 past the third fin 104c to a third distance 512 at the first height 528 and in the first direction 504 past the third fin 104c to a fourth distance 514 at the first height 528. In some embodiments, the first distance 508 may be smaller than the second distance 510 and the third distance 512 may be smaller than the fourth distance 514. In some embodiments, the first distance 508 and the third distance 512 may be in a range of between approximately 5 nm to approximately 15 nm, between approximately 2 nm and approximately 10 nm, or other similar values. In some embodiments, the second distance 510 and the fourth distance 514 may be in a range of between approximately 15 nm to approximately 25 nm, between approximately 10 nm and approximately 30 nm, or other similar values.

In some embodiments, the second source/drain segment 114b may laterally extend past the second fin 104b in opposing directions to substantially equal distances, 516 and 518, at the first height 528. In some additional embodiments, the second source/drain segment 114b may be substantially symmetric in relation to the second fin 104b. In some embodiments, the substantially equal distances, 516 and 518, may be larger than the second distance 510 and/or the third distance 512. In some embodiments, the substantially equal distances, 516 and 518, may be in a range of between approximately 25 nm and approximately 30 nm, between approximately 20 nm and approximately 35 nm, or other similar values.

In some embodiments, distances 508-518 may be greater than a thickness of the fin spacer 110, so that the plurality of source/drain segments 114a-114c laterally extend past an underlying sidewall of the fin spacer 110. In some embodiments, one or more of the plurality of source/drain segments 114a-114c may extend over an underlying upper surface of the fin spacer and to vertically below the underlying upper surface of the fin spacer 110. In such embodiments, one or more of the plurality of source/drain segments 114a-114c may wrap around opposing sides of the fin spacer 110.

In some embodiments, the epitaxial source/drain regions 112 may laterally extend in the first direction 504 past the first fin 104a to a greater distance as height of the epitaxial source/drain regions 112 increase. For example, in some embodiments, the epitaxial source/drain regions 112 may laterally extend in the first direction 504 to a fifth distance 520 past the first fin 104a at a second height 530 greater than the first height 528. Similarly, in some embodiments, the epitaxial source/drain regions 112 may laterally extend in the second direction 506 past the third fin 104c to a greater distance as a height of the third fin 104c increases. For example, in some embodiments, the epitaxial source/drain regions 112 may laterally extend in the second direction 506 to a sixth distance 522 past the third fin 104c at the second height 530. In some embodiments, the fifth distance 520 may be approximately equal to the sixth distance 522.

In some embodiments, the epitaxial source/drain regions 112 may laterally and continuously extend at the second height 530 between the first fin 104a and second fin 104b by a seventh distance 524 and between the second fin 104b and the third fin 104c by an eighth distance 526. In some embodiments, the seventh distance 524 and the eighth distance 526 may be substantially equal. In some embodiments, the seventh distance 524 and the eighth distance 526 may be larger than twice the fifth distance 520 and/or the sixth distance 522. In some embodiments, the seventh distance 524 and the eighth distance 526 may be in a range of between approximately 25 nm to approximately 50 nm, between approximately 20 nm and approximately 60 nm, or other similar values.

Figure 6A:
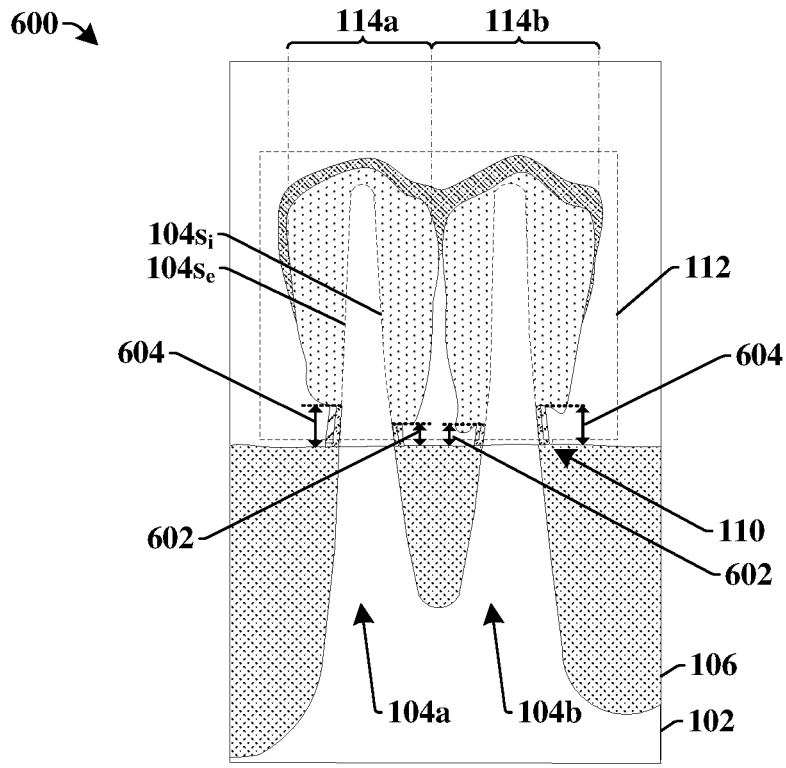
FIGS. 6A-6B illustrate some additional embodiments of integrated chips having a FinFET device comprising a fin spacer.
Figure 6B:
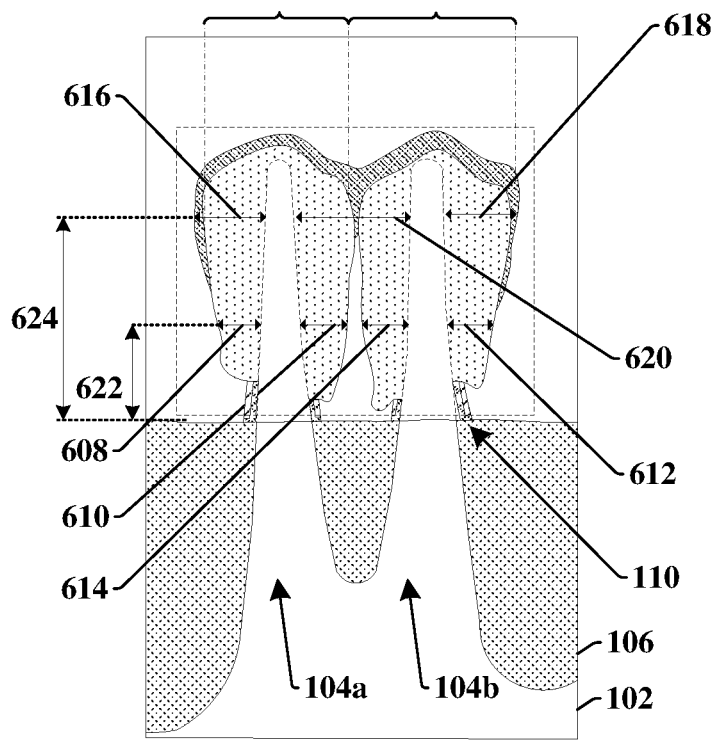

FIGS. 6A-6B illustrate cross-sectional views of some additional embodiments of integrated chips having a FinFET device comprising a fin spacer configured to control formation of epitaxial source/drain regions.

As shown in cross-sectional view 600 of FIG. 6A, the integrated chip comprises a FinFET device having epitaxial source/drain regions 112 that continuously extend over a plurality of fins 104a-104c. The epitaxial source/drain regions 112 comprise a plurality of source/drain segments 114a-114c. In some embodiments, the plurality of source/drain segments 114a-114b comprise a first source/drain segment 114a disposed over a first fin 104a and a second source/drain segment 114b disposed over a second fin 104b.

In some embodiments, the first source/drain segment 114a may have an interior sidewall $104s_i$ that faces the second source/drain segment 114b and that is covered by a fin spacer 110, and an exterior sidewall $104s_e$ that faces away from the second source/drain segment 114b and that is covered by the fin spacer 110. Similarly, the second source/drain segment 114b may have an interior sidewall $104s_i$ that faces the first source/drain segment 114a and that is covered by the fin spacer 110 and an exterior sidewall $104s_e$ that faces away from the first source/drain segment 114a and that is covered by the fin spacer 110. The interior sidewall $104s_i$ the exterior sidewall $104s_e$ have different heights. For example, the exterior sidewall $104s_e$ may have a greater height than the interior sidewall $104s_i$. In some embodiments, the interior sidewall $104s_i$ has a first height 602 that is in a range of between approximately 2 nm and approximately 6 nm, between approximately 3 nm and approximately 8 nm, or other suitable values. In some embodiments, the exterior sidewall $104s_e$ has a second height 604 that is in a range of between approximately 5 nm and approximately 10 nm, between approximately 7 nm and approximately 15 nm, or other suitable values.

As shown in cross-sectional view 606 of FIG. 6B, in some embodiments the first source/drain segment 114a may be asymmetric in relation to the first fin 104a and the second source/drain segment 114b may be asymmetric in relation to the second fin 104b. In some embodiments, the first source/drain segment 114a may laterally extend past the first fin 104a in opposing directions to different distances and the second source/drain segment 114b may laterally extend past the second fin 104b in opposing directions to different distances. For example, in some embodiments, the first source/drain segment 114a may laterally extend in a first direction 504 past the first fin 104a to a first distance 608 at a first height 622 and in a second direction 506 past the first fin 104a to a second distance 610 at the first height 622. Similarly, the second source/drain segment 114b may laterally extend in the second direction 506 past the second fin 104b to a third distance 612 at the first height 622 and in the first direction 504 past the second fin 104b to a fourth distance 614 at the first height 622. In some embodiments, the first distance 608 may be smaller than the second distance 610 and the fourth distance 614 may be smaller than the third distance 612. In some embodiments, the first distance 608 and the third distance 612 may be in a range of between approximately 5 nm to approximately 15 nm, between approximately 2 nm and approximately 10 nm, or other similar values. In some embodiments, the second distance 610 and the fourth distance 614 may be in a range of between approximately 15 nm to approximately 25 nm, between approximately 10 nm and approximately 30 nm, or other similar values.

In some embodiments, the epitaxial source/drain regions 112 may laterally extend in the first direction 504 past the first fin 104a to a greater distance as a height of the first fin 104a increases. For example, in some embodiments, the epitaxial source/drain regions 112 may laterally extend in the first direction 504 to a fifth distance 616 past the first fin 104a at a second height 624 greater than the first height 622. Similarly, in some embodiments, the epitaxial source/drain regions 112 may laterally extend in the second direction 506 past the second fin 104b to a greater distance as a height of the second fin 104b increases. For example, in some embodiments, the epitaxial source/drain regions 112 may laterally extend in the second direction 506 to a sixth distance 618 past the second fin 104b at the second height 624. In some embodiments, the fifth distance 616 may be approximately equal to the sixth distance 618.

In some embodiments, the epitaxial source/drain regions 112 may laterally and continuously extend at the second height 624 between the first fin 104a and second fin 104b by a seventh distance 620. In some embodiments, the seventh distance 620 may be larger than twice the fifth distance 616 and/or the sixth distance 618. In some embodiments, the seventh distance 620 may be in a range of between approximately 25 nm to approximately 50 nm, between approximately 20 nm and approximately 60 nm, or other similar values.

FIGS. 7A-19B illustrate some embodiments of a method of forming an integrated chip having a FinFET device comprising a fin spacer that is configured to control formation of epitaxial source/drain regions. Although FIGS. 7A-19B are described in relation to a method, it will be appreciated that the structures disclosed in FIGS. 7A-19B are not limited to such a method, but instead may stand alone as structures independent of the method.

As shown in three-dimensional view 700 of FIG. 7A, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. FIG. 7B illustrates a cross-sectional view 706 along cross-sectional line A-A' of FIG. 7A and FIG. 7C illustrates a cross-sectional view 708 along cross-sectional line B-B' of FIG. 7A.

A first etching process is performed to selectively pattern the substrate 102 and to form sidewalls 102s of the substrate 102 to define a plurality of fins 104a-104c that protrude outward from an upper surface 102u of the substrate 102. In some embodiments, the first etching process may be performed by selectively exposing the substrate 102 to one or more etchants 702 according to a first masking structure 704. In some embodiments, the one or more etchants 702 may comprise a dry etchant, a wet etchant, or the like. In some embodiments, the first masking structure 704 may comprise a photosensitive material (e.g., photoresist), a hard mask, and/or the like. In some embodiments, the one or more etchants 702 may comprise a dry etchant having a chlorine based etching chemistry, a fluorine based etching chemistry, and/or the like.

As shown in three-dimensional view 800 of FIG. 8A, a dielectric material 106 is formed on the substrate 102 and between the plurality of fins 104a-104c. The plurality of fins 104a-104c are configured to protrude outward to a non-zero distance 802 past an upper surface of the dielectric material 106. FIG. 8B illustrates a cross-sectional view 804 of the substrate 102 along cross-sectional line A-A' of FIG. 8A and FIG. 8C illustrates a cross-sectional view 806 along cross-sectional line B-B' of FIG. 8A.

In some embodiments, the dielectric material 106 may comprise an oxide (e.g., silicon oxide, silicon dioxide, etc.), a nitride (e.g., silicon nitride), a carbide (e.g., silicon carbide), or the like. In some embodiments, the dielectric material 106 may be formed by a deposition process (e.g., a physical vapor deposition (PVD) process, a chemical vapor deposition process (CVD), a plasma enhanced CVD (PE-CVD) process, an atomic layer deposition (ALD) process, or the like), a spin-on process, or the like.

As shown in three-dimensional view 900 of FIG. 9A, a gate dielectric 220 is formed on the plurality of fins 104a-104c. The gate dielectric 220 is formed to extend along sidewalls and uppermost surfaces of the plurality of fins 104a-104c. FIG. 9B illustrates a cross-sectional view 902 along cross-sectional line A-A' of FIG. 9A and FIG. 9C illustrates a cross-sectional view 904 along cross-sectional line B-B' of FIG. 9A.

In some embodiments, the gate dielectric 220 may comprise an oxide (e.g., silicon oxide, silicon dioxide, etc.), a nitride (e.g., silicon nitride), a carbide (e.g., silicon carbide), or the like. In some embodiments, the gate dielectric 220 may be formed by a thermal oxidation process. In other embodiments, the gate dielectric 220 may be formed by a deposition process (e.g., a physical vapor deposition (PVD) process, a chemical vapor deposition process (CVD), a plasma enhanced CVD (PE-CVD) process, an atomic layer deposition (ALD) process, or the like), a spin-on process, or the like. In some such embodiments (not shown), the gate dielectric 220 may continuously extend along the upper surface of the dielectric material 106 between the plurality of fins 104a-104c (e.g., between a first fin 104a and a second fin 104b).

As shown in three-dimensional view 1000 of FIG. 10A, a gate structure 108 is formed over the plurality of fins 104a-104c and over the dielectric material 106. In some embodiments, the gate structure 108 wraps around three sides of respective ones of the plurality of fins 104a-104c. For example, the gate structure 108 may extend along sidewalls and an upper surface of respective ones of the plurality of fins 104a-104c. FIG. 10B illustrates a cross-sectional view 1002 along cross-sectional line A-A' of FIG. 10A and FIG. 10C illustrates a cross-sectional view 1004 along cross-sectional line B-B' of FIG. 10A.

The gate structure 108 may comprise a conductive gate electrode 218 disposed between sidewall spacers 222. In some embodiments, the conductive gate electrode 218 is separated from the plurality of fins 104a-104c by way of the gate dielectric 220. In some such embodiments, the gate dielectric 220 may comprise an oxide, a nitride, or the like, and the conductive gate electrode may comprise polysilicon, or the like. In other such embodiments, the gate structure 108 may comprise a dummy gate structure. In such embodiments (not shown), a replacement metal gate process may be subsequently performed. The replacement metal gate process removes a part of the dummy gate structure after the formation of sidewall spacers 222, and a gate dielectric material and a gate metal are formed in place of the removed part of the dummy gate structure. In some embodiments, the gate dielectric material may comprise a high-k dielectric layer such as hafnium oxide ($HfO_2$), $TiO_2$, HfZrO, $Ta_2O_3$, $HfSiO_4$, $ZrO_2$, $ZrSiO_2$, etc., and the gate metal may comprise aluminum, tungsten, ruthenium, or the like.

Figure 11A:
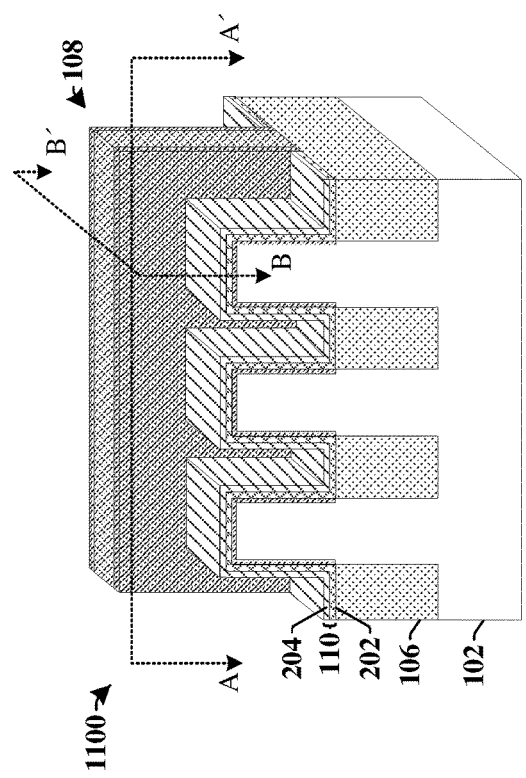
FIGS. 11A-11C illustrate a three-dimensional view and associated cross-sectional views corresponding to some embodiments of a method of forming an integrated chip having a FinFET device comprising a disclosed fin spacer.
Figure 11C:
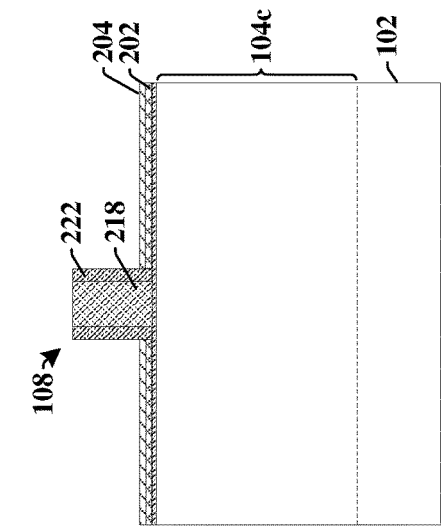
Figure 11B:
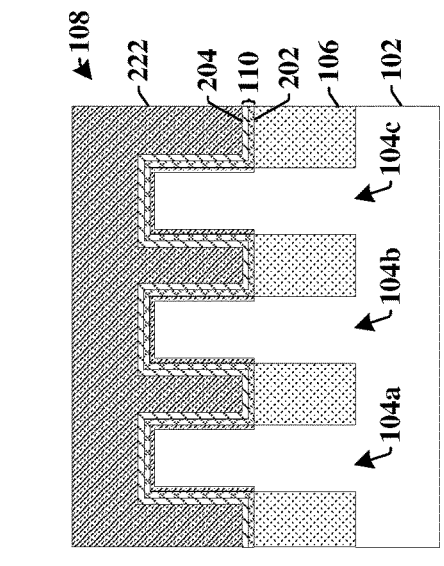

As shown in three-dimensional view 1100 of FIG. 11A, a fin spacer 110 is formed over the plurality of fins 104a-104c. The fin spacer 110 is formed to extend along sidewalls and uppermost surfaces of the plurality of fins 104a-104c. In some embodiments, the fin spacer 110 may comprise a plurality of stacked liner layers including different materials. For example, in some embodiments, the fin spacer 110 may comprise a first liner layer 202 and a second liner layer 204 over the first liner layer 202. In some embodiments, the first liner layer 202 and the second liner layer 204 may vertically extend to a same maximum height over the dielectric material 106. In some embodiments, the first liner layer 202 may comprise a first dielectric material and the second liner layer 204 may comprise a second dielectric material. In some embodiments, the first dielectric material may be different than the second dielectric material. In some embodiments, the first dielectric material may comprise a nitride (e.g., silicon nitride), an oxide (e.g., silicon oxide), or the like. In some embodiments, the second liner layer 204 may comprise a silicon carbon nitride (SiCN), silicon carbon oxynitride (SiCON), or the like. FIG. 11B illustrates a cross-sectional view 1102 along cross-sectional line A-A' of FIG. 11A and FIG. 11C illustrates a cross-sectional view 1104 along cross-sectional line B-B' of FIG. 11A.

In some embodiments, the fin spacer 110 may be formed during a same deposition as the sidewall spacers 222 (e.g., shown in FIGS. 10A-10C). In other embodiments, the fin spacer 110 may be formed during a deposition that is subsequent to the deposition used to form the sidewall spacers 222. In yet additional embodiments, part of the fin spacer 110 may be formed during a same deposition as the sidewall spacers 222, while another part of the fin spacer 110 may be formed during a subsequent deposition.

As shown in three-dimensional view 1200 of FIG. 12A, a second etching process is performed to etch the plurality of fins 104a-104c and the fin spacer 110. The second etching process etches the fin spacer 110 to give the fin spacer 110 different heights along different sidewalls of the plurality of fins 104a-104c. For example, in some embodiments, the second etching process causes the fin spacer 110 to extend to a first height 116 along an outermost sidewall of a first fin 104a and/or a third fin 104c, to a second height 118 along an interior sidewall of the first fin 104a and/or the third fin 104c, and to a third height 119 along interior sidewalls of a second fin 104b. In some embodiments, the second etching process may remove the fin spacer 110 from along horizontally extending surfaces of the dielectric material 106. The second etching process also etches the plurality of fins 104a-104c to remove parts of the plurality of fins 104a-104c that are outside of the gate structure 108, so as to define source/drain recesses 1202a-1202c within the plurality of fins 104a-104c. FIG. 12B illustrates a cross-sectional view 1206 along cross-sectional line A-A' of FIG. 12A and FIG. 12C illustrates a cross-sectional view 1208 along cross-sectional line B-B' of FIG. 12A.

In some embodiments, the second etching process may have an etching selectivity that is configured to remove the plurality of fins 104a-104c at a greater etching rate than the fin spacer 110. In some embodiments, the second etching process may comprise a single etching process having a single etchant 1204. In other embodiments, the second etching process may comprise more than one etchant. In some embodiments, the second etching process may comprise a dry etching process (e.g., a reactive ion etching process, an ion bombardment etching process, or the like).

In some embodiments, a masking layer (not shown) may be formed on the substrate 102 prior to performing the second etching process. The masking layer may be formed to a thickness that is less than heights of the plurality of fins 104a-104c, so that the masking layer covers lower portions of the plurality of fins 104a-104c and the fin spacer 110. Because the plurality of fins 104a-104c have a large aspect ratio (e.g., are close together), it may be more difficult to form the masking layer between adjacent ones of the plurality of fins 104a-104c thereby causing the masking layer to be formed to a smaller height between adjacent ones the plurality of fins 104a-104c. The second etching process is subsequently performed according to the masking layer, resulting in the fin spacer 110 having smaller heights between adjacent ones of the plurality of fins 104a-104c.

Figure 13B:
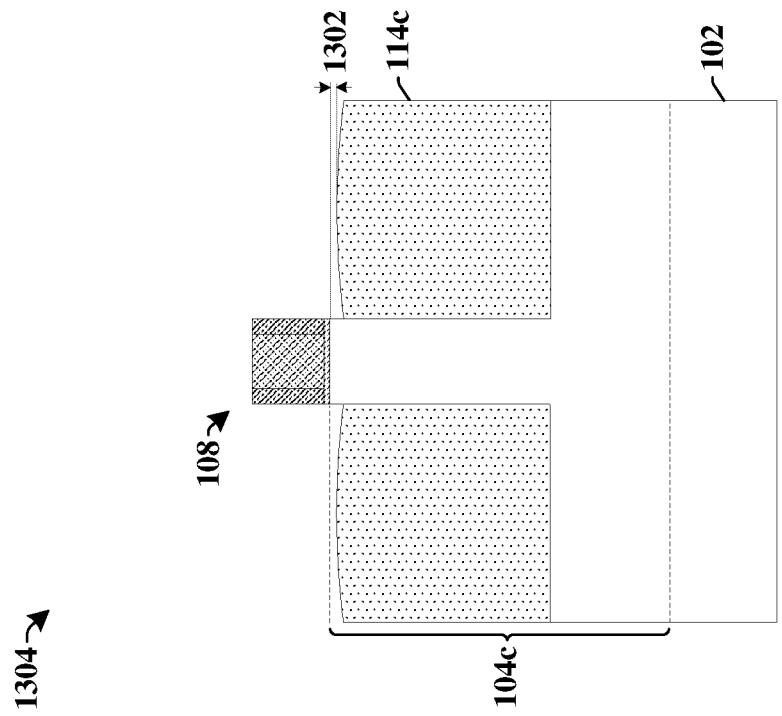
FIGS. 13A-13B illustrate cross-sectional views corresponding to some embodiments of a method of forming an integrated chip having a FinFET device comprising a disclosed fin spacer.
Figure 13A:
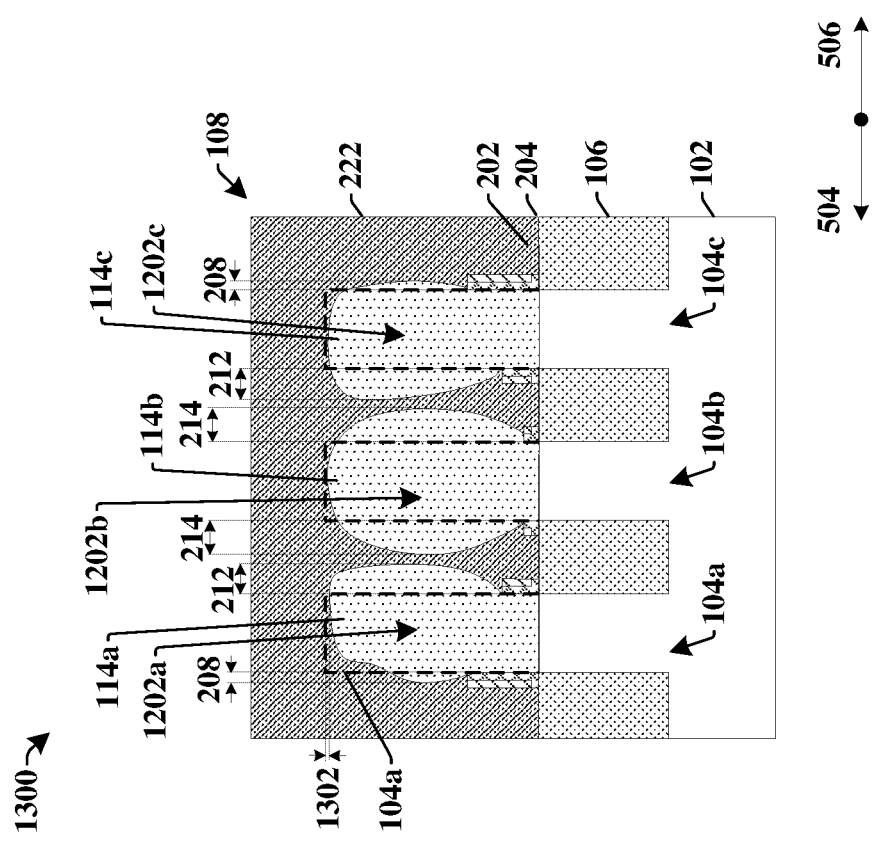

As shown in cross-sectional views 1300 and 1304 of FIGS. 13A-13B, a plurality of source/drain segments 114a-114c are formed within the source/drain recesses 1202a-1202c. In some embodiments, the plurality of source/drain segments 114a-114c are formed by way of an epitaxial growth process. The epitaxial growth process grows in both lateral and vertical directions. However, the fin spacer 110 is configured to mitigate (e.g., block) a growth along the lateral direction until material of the epitaxial growth process is above sidewalls of the fin spacer 110. Therefore, because the sidewalls of the fin spacer 110 are at different heights, the epitaxial growth process will form the plurality of source/drain segments 114a-114c to extend to different distance past underlying ones of the plurality of fins 104a-104c. For example, in some embodiments, the plurality of source/drain segments 114a-114c may extend in a first direction 504 to a first distance 208 past the first fin 104a and/or the third fin 104c, in a second direction 506 to a second distance 212 past the first fin 104a and or the third fin 104c, and in the first direction 504 and the second direction 506 to a third distance 214 past the second fin 104b.

In some embodiments, the plurality of source/drain segments 114a-114c may comprise a semiconductor material, a compound semiconductor material, or the like. For example, in some embodiments the plurality of source/drain segments 114a-114c may comprise silicon arsenide, silicon germanium, or the like. In some embodiments, the plurality of source/drain segments 114a-114c may comprise a semiconductor material that is doped with a first dopant species having a first doping type and a first doping concentration. In some embodiments, the plurality of source/drain segments 114a-114c may comprise silicon arsenide having a silicon concentration of approximately $1\times10^{20}$ at/cm$^3$ and an arsenic concentration of approximately $1\times10^{21}$ at/cm$^3$. In some embodiments, the epitaxial growth process may comprise a CVD process, a PE-CVD process, or the like.

In some embodiments, a third etching process may be performed on the plurality of source/drain segments 114a-114c after the epitaxial growth process is completed. The third etching process controls a merger between the plurality of source/drain segments 114a-114c and may also reduce a height of the plurality of source/drain segments 114a-114c. In some embodiments, the third etching process may result in the plurality of source/drain segments 114a-114c being both asymmetric (e.g., extending past opposing sides of a first fin 104a to different distances) and laterally separated from one another after the third etching process. In some embodiments, the third etching process may result in the plurality of source/drain segments 114a-114c having one or more surfaces with a (110) facet. In some embodiments, the plurality of source/drain segments 114a-114c may be formed and/or etched to a height that is less than a height of the plurality of fins 104a-104c (e.g., that is below the uppermost surfaces of the plurality of fins 104a-104c directly below the gate structure 108). In such embodiments, the plurality of fins 104a-104c extend a distance 1302 above tops of the plurality of source/drain segments 114a-114c.

In some embodiments, the third etching process may be performed by exposing the plurality of source/drain segments 114a-114c to a third etchant for a third time. In some embodiments, the third etchant may comprise a dry etchant. In some embodiments, the dry etchant may comprise hydrogen chloride (HCl), carbon tetrafluoride (CF$_4$), and/or the like. In some embodiments, the third etchant may comprise HCl having a flow rate in a range of between approximately 100 sccm (standard cubic centimeters per minute) and approximately 700 sccm, between approximately 200 sccm and approximately 500 sccm, or other similar values. In some embodiments, the third time may be in a range of between approximately 10 seconds and approximately 30 seconds, between approximately 5 seconds and approximately 40 seconds, or other similar values.

As shown in cross-sectional views 1400 and 1402 of FIGS. 14A-14B, a doped epitaxial material 302 is formed over the plurality of source/drain segments 114a-114c. The doped epitaxial material 302 extends around and between the plurality of source/drain segments 114a-114c. In some embodiments, the doped epitaxial material 302 is formed to directly contact opposing sides of the plurality of source/drain segments 114a-114c. In some embodiments, the doped epitaxial material 302 is deposited by way of an epitaxial growth process (e.g., CVD process, a PE-CVD process, or the like). In some embodiments, because the source/drain segments 114a-114c may be formed to a height that is less than a height of the plurality of fins 104a-104c, the doped epitaxial material 302 may be formed along sidewalls of the plurality of fins 104a-104c, thereby improving performance of an associated multi-fin transistor device. In some embodiments, the doped epitaxial material 302 may be formed to continuously extend over and between the plurality of fins 104a-104c.

In some embodiments, the doped epitaxial material 302 may comprise a doped semiconductor material, a compound semiconductor material, or the like. In some embodiments, the doped epitaxial material 302 may comprise a semiconductor material that is doped with second dopant species having the first doping type and a second doping concentration that is higher than the first doping concentration of the source/drain segments 114a-114c. For example, in some embodiments the doped epitaxial material 302 may comprise silicon phosphide, or the like. In some embodiments, the doped epitaxial material 302 may comprise silicon phosphide having a silicon concentration of approximately $2\text{-}5\times10^{22}$ at/cm$^3$ and a phosphorous concentration of approximately $2\text{-}5\times10^{21}$ at/cm$^3$. The doped epitaxial material 302 is formed to have a relatively small height between adjacent ones of the plurality of source/drain segments 114a-114c so as to keep the second dopant species (e.g., phosphorous dopants) of the doped epitaxial material 302, which have a higher dopant concentration than the first dopant species within the plurality of source/drain segments 114a-114c, away from the underlying substrate 102, thereby improving short channel effects in an associated multi-fin transistor device.

In some embodiments, a fourth etching process may be performed on the doped epitaxial material 302 after deposition of the doped epitaxial material 302 is completed. The fourth etching process gives the doped epitaxial material 302 a wavy profile (e.g., a profile that has a height that increases and decreases multiple times over a width of the doped epitaxial material 302). In some embodiments, the wavy profile may be defined by one or more surfaces of the doped epitaxial material 302 having a (111) facet. In some embodiments, the fourth etching process may be performed by exposing the doped epitaxial material 302 to a fourth etchant for a fourth time. In some embodiments, the fourth etchant may comprise a dry etchant. In some embodiments, the dry etchant may comprise hydrogen chloride (HCl), carbon tetrafluoride ($CF_4$), silane ($SiH_4$), and/or the like. In some embodiments, the fourth etchant may comprise HCl with a first flow rate and $SiH_4$ with a second flow rate that is lower than the first flow rate. In some embodiments, the first flow rate may be in a range of between approximately 50 sccm and approximately 300 sccm, between approximately 100 sccm and approximately 200 sccm, or other similar values. In some embodiments, the second flow rate may be in a range of between approximately 10 sccm and approximately 200 sccm, between approximately 20 sccm and approximately 100 sccm, or other similar values. In some embodiments, the fourth time may be in a range of between approximately 10 seconds and approximately 30 seconds, between approximately 5 seconds and approximately 40 seconds, or other similar values. In some embodiments, the fourth time may be shorter than the third time. Such exemplary features of the fourth etching process are able to provide for the wavy profile of the doped epitaxial material 302 without forming spaces between the doped epitaxial material 302 arranged on different ones of the plurality of source/drain segments 114a-114c.

As shown in cross-sectional views 1500 and 1502 of FIGS. 15A-15B, a cap layer 408 is formed onto the doped epitaxial material 302. The cap layer 408 extends continuously extends along an upper surface of the doped epitaxial material 302. In some embodiments, the cap layer 408 is deposited by way of a deposition process (e.g., CVD process, a PE-CVD process, or the like). The cap layer 408 is configured to mitigate out diffusion of dopants from the doped epitaxial material 302 into an overlying layer (e.g., into overlying silicide of FIG. 18A). In some embodiments, the cap layer 408 may comprise a doped semiconductor material, a compound semiconductor material, or the like. In some embodiments, the cap layer 408 may comprise a semiconductor material that is doped with the second dopant species having the first doping type and a third doping concentration that is lower than the second doping concentration of the doped epitaxial material 302. For example, in some embodiments the cap layer 408 may comprise silicon phosphide, or the like. In some embodiments, the cap layer 408 may comprise silicon phosphide having a silicon concentration of approximately $4\text{-}5\times10^{22}$ at/$cm^3$ and a phosphorous concentration of approximately $1\text{-}2\times10^{21}$ at/$cm^3$.

In some embodiments, a fifth etching process may be performed on the cap layer 408 after deposition of the cap layer 408 is completed. The fifth etching process gives the cap layer 408 a wavy profile having troughs 404 and crests 406. In some embodiments, the wavy profile may be defined by one or more surfaces of the cap layer 408 having a (111) facet. In some embodiments, the fifth etching process may be performed by exposing the cap layer 408 to a fifth etchant for a fifth time. In some embodiments, the fifth etchant may comprise a dry etchant. In some embodiments, the dry etchant may comprise hydrogen chloride (HCl), carbon tetrafluoride ($CF_4$), germane ($GeH_4$), and/or the like. In some embodiments, the fifth etchant may comprise HCl with a first flow rate and $GeH_4$ with a second flow rate that is greater than the first flow rate. In some embodiments, the first flow rate may be in a range of between approximately 50 sccm and approximately 300 sccm, between approximately 200 sccm and approximately 300 sccm, or other similar values. In some embodiments, the second flow rate may be in a range of between approximately 200 sccm and approximately 600 sccm, between approximately 300 sccm and approximately 500 sccm, or other similar values. In some embodiments, the fifth time may be in a range of between approximately 10 seconds and approximately 30 seconds, between approximately 5 seconds and approximately 40 seconds, or other similar values. In some embodiments, the fifth time may be shorter than the third time. Such exemplary features of the fifth etching process are able to provide for the wavy profile of the cap layer 408 without forming spaces between the cap layer 408 arranged on different ones of the plurality of source/drain segments 114a-114c. As shown in cross-sectional views 1600 and 1608 of FIGS. 16A-16B, an inter-level dielectric (ILD) layer 410 is formed onto cap layer 408. The ILD layer 410 is formed to extend over the gate structure 108 and the epitaxial source/drain regions 112. In some embodiments, the ILD layer 410 may comprise silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like. In various embodiment, the ILD layer 410 may be formed by way of a deposition process (e.g., PVD, CVD, PE-CVD, or the like), a spin-on process, or the like. In some embodiments, a contact etch stop layer (CESL) 409 may be formed over the cap layer 408 and the fin spacer 110 prior to forming the ILD layer 410. In some embodiments, the CESL 409 may comprise a nitride (e.g., silicon nitride), a carbide (e.g., silicon carbide), or the like. In various embodiment, the CESL 409 may be formed by way of a deposition process (e.g., PVD, CVD, PE-CVD, or the like).

A sixth etching process is performed on the ILD layer 410 to define interconnect openings 1602 that expose upper surface of the epitaxial source/drain regions 112. In some embodiments, sixth etching process is performed by exposing the ILD layer 410 to one or more etchants 1604 according to a second masking structure 1606. The interconnect openings 1602 extend from an uppermost surface of the ILD layer 410 to the upper surfaces of the epitaxial source/drain regions 112. In some embodiments, the interconnect openings 1602 laterally extends over multiple ones of the plurality of source/drain segments 114a-114c.

As shown in cross-sectional views 1700 and 1704 of FIGS. 17A-17B, a seventh etching process is performed to remove exposed parts of the cap layer 408 and to expose the doped epitaxial material 302. In some embodiments, the seventh etching process may reduce a thickness of the doped epitaxial material 302. For example, in some embodiments, the seventh etching process may reduce a thickness of the doped epitaxial material 302 between approximately 1 nm and approximately 10 nm. In some embodiments, the seventh etching process may be performed by selectively exposing the cap layer 408 and the doped epitaxial material 302 to one or more etchants 1702 according to the second masking structure 1606. In some embodiments, the one or more etchants 1702 may comprise a dry etchant, a wet etchant, or the like.

Figure 18B:
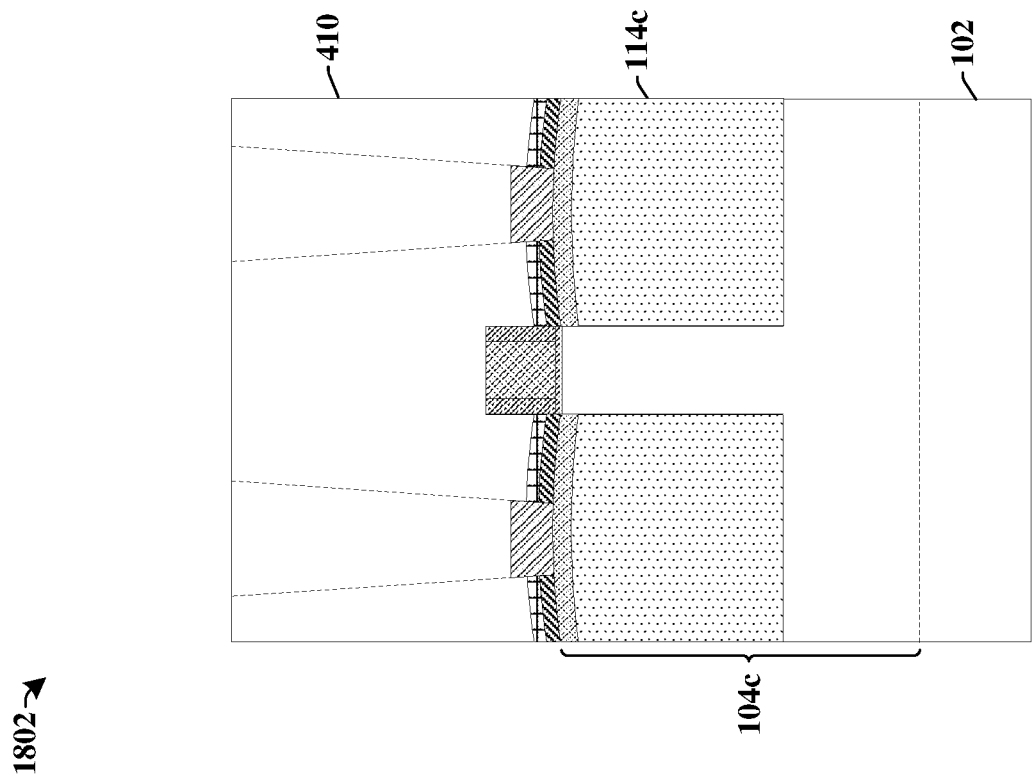
FIGS. 18A-18B illustrate cross-sectional views corresponding to some embodiments of a method of forming an integrated chip having a FinFET device comprising a disclosed fin spacer.
Figure 18A:
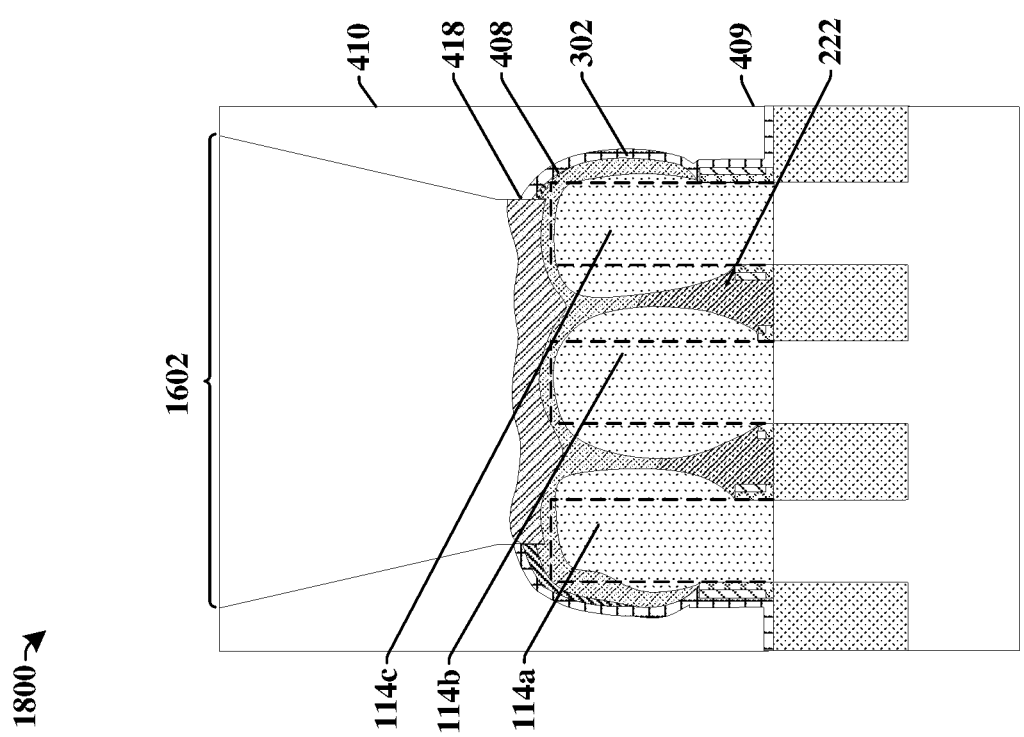

As shown in cross-sectional views 1800 and 1802 of FIGS. 18A-18B, a silicidation process is performed to form a silicide 418 on the doped epitaxial material 302. In some embodiments, the silicidation process may be performed by depositing a metal layer (e.g., a nickel layer) and then performing a thermal annealing process (e.g., a rapid thermal anneal) to form the silicide 418. The wavy upper surface of the doped epitaxial material 302 increases a surface area of contact between the silicide 418 and the doped epitaxial material 302, thereby reducing a resistance of the silicide 418 and improving a performance of an associated multi-fin transistor device.

Figure 19B:
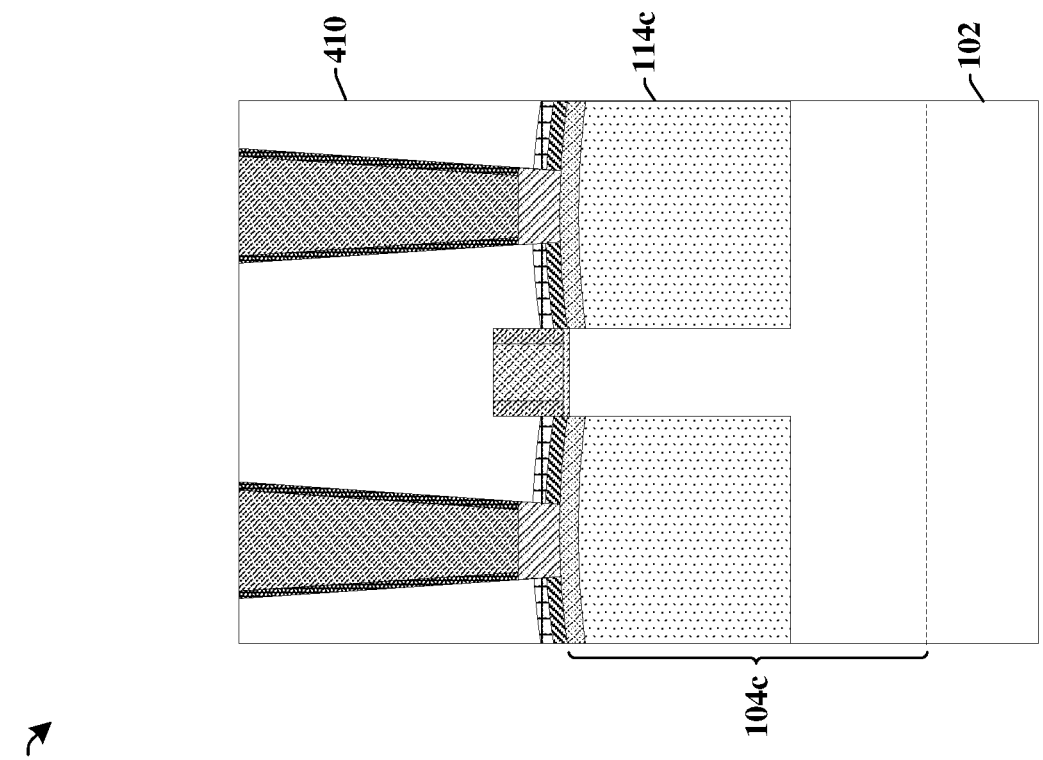
FIGS. 19A-19B illustrate cross-sectional views corresponding to some embodiments of a method of forming an integrated chip having a FinFET device comprising a disclosed fin spacer.
Figure 19A:
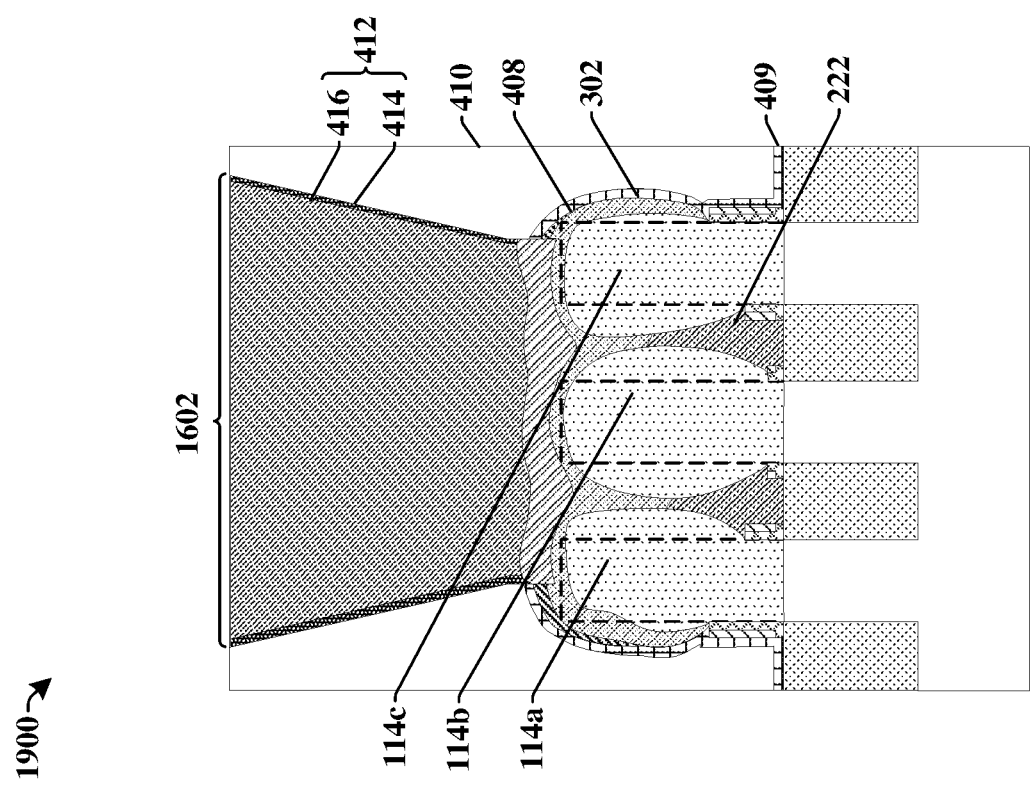

As shown in cross-sectional views 1900 and 1902 of FIGS. 19A-19B, interconnects 412 are formed within the interconnect openings 1602. In some embodiments, the interconnects 412 may be formed by forming a conductive material 416 within the interconnect openings 1602. In some embodiments, a liner 414 may be formed along sidewalls of the ILD layer 410 that define the interconnect openings 1602 prior to forming the conductive material 416 within the interconnect openings 1602. In some embodiments, the liner 414 may be formed by way of a deposition process. In some embodiments, the conductive material 416 may be formed by way of a deposition process and/or a plating process (e.g., electroplating, electro-less plating, etc.). In some embodiments, the liner 414 may comprise titanium, titanium nitride, tantalum, tantalum nitride, or the like. In various embodiments, the conductive material 416 may comprise copper, aluminum, or the like. After forming the conductive material 416 within the interconnect opening 1602s, a planarization process may be performed to remove excess of the conductive material from over ILD layer 410.

Figure 20:
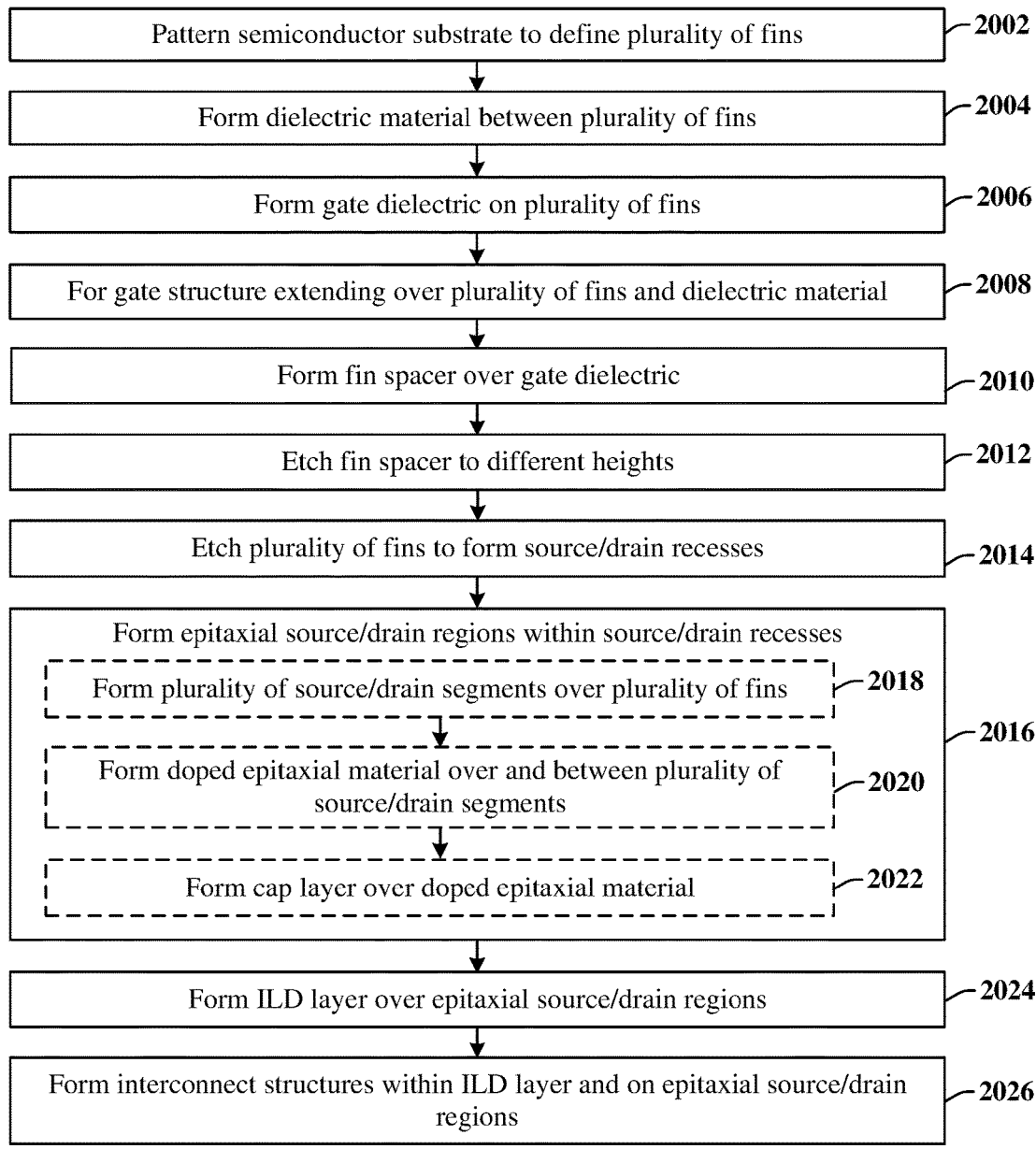
FIG. 20 illustrates a flow diagram of some embodiments of a method of forming an integrated chip having a FinFET device comprising a fin spacer configured to control formation of epitaxial source/drain regions.

FIG. 20 illustrates a flow diagram of some embodiments of a method 2000 of forming an integrated chip having a FinFET device comprising a fin spacer configured to control formation of epitaxial source/drain regions.

While the disclosed method 2000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2002, a semiconductor substrate is patterned to define a plurality of fins. FIGS. 7A-7C illustrate some embodiments corresponding to act 2002.

At act 2004, a dielectric material is formed between the plurality of fins. FIGS. 8A-8C illustrate some embodiments corresponding to act 2004.

At act 2006, a gate dielectric is formed on the plurality of fins. FIGS. 9A-9C illustrate some embodiments corresponding to act 2008.

At act 2008, a gate structure is formed to extend over the plurality of fins and the dielectric material. FIGS. 10A-10C illustrate some embodiments corresponding to act 2008.

At act 2010, a fin spacer is formed over the gate dielectric. FIGS. 11A-11C illustrate some embodiments corresponding to act 2010.

At act 2012, the fin spacer is etched to different heights. FIGS. 12A-12C illustrate some embodiments corresponding to act 2012.

At act 2014, the plurality of fins are etched to form source/drain recesses. In some embodiments, acts 2012-2014 may be performed by a same etching process. In other embodiments, more than one etching process may be performed to perform acts 2012-2014. FIGS. 12A-12C illustrate some embodiments corresponding to act 2014.

At act 2016, epitaxial source/drain regions are formed within the source/drain recesses. In some embodiments, the epitaxial source/drain regions may be formed according to acts 2018 and 2022.

At act 2018, a plurality of source/drain segments are formed within the source/drain recesses. FIGS. 13A-13B illustrate some embodiments corresponding to act 2018.

At act 2020, a doped epitaxial material is formed on the plurality of source/drain segments. FIGS. 14A-14B illustrate some embodiments corresponding to act 2020.

At act 2022, a cap layer is formed on the doped epitaxial material to define the epitaxial source/drain regions. FIGS. 15A-15B illustrate some embodiments corresponding to act 2022.

At act 2024, an ILD layer is formed over the epitaxial source/drain regions. FIGS. 16A-16B illustrate some embodiments corresponding to act 2024.

At act 2026, interconnect structures are formed within the ILD layer and on the epitaxial source/drain regions. FIGS. 17A-19C illustrate some embodiments corresponding to act 2026.

Accordingly, in some embodiments, the present disclosure relates to an integrated chip having a fin spacer that is configured to control lateral growth of epitaxial source/drain regions of FinFET devices. Controlling the lateral growth of epitaxial source/drain regions improves a reliability of the integrated chip by mitigating merger of epitaxial source/drain regions of adjacent devices.

In some embodiments, the present disclosure relates to an integrated chip. The integrated chip includes a semiconductor substrate having sidewalls that define a plurality of fins; a dielectric material arranged between the plurality of fins; a gate structure disposed over the dielectric material and around the plurality of fins; and epitaxial source/drain regions disposed along opposing sides of the gate structure and respectively having a plurality of source/drain segments disposed on the plurality of fins and a doped epitaxial material disposed onto and between the plurality of source/drain segments, a first source/drain segment of the plurality of source/drain segments laterally extends in opposing directions to different distances past opposing sides of an underlying first fin of the plurality of fins. In some embodiments, the first source/drain segment extends past the first fin in a first direction to a first distance and the first source/drain segment extends past the first fin in a second direction to a second distance that is larger than the first distance, the second direction opposite the first direction. In some embodiments, the plurality of fins include a second fin that is separated from the first fin along the second direction. In some embodiments, the plurality of fins include a third fin that is separated from the first fin by the second fin; and a second source/drain segment of the plurality of source/drain segments laterally extends in the first direction and the second direction to substantially equal distances past opposing sides of the second fin. In some embodiments, the plurality of source/drain segments extend to below a bottom of the doped epitaxial material. In some embodiments, the integrated chip further includes a fin spacer arranged along sidewalls of the plurality of source/drain segments, the fin spacer extending to a first height over the dielectric material along a first side of the first source/drain segment and to a second height over the dielectric material along an opposing second side of the first source/drain segment, the first height different than the second height. In some embodiments, the plurality of source/drain segments extend below an upper surface of the fin spacer. In some embodiments, fin spacer includes a first liner layer and a second liner layer over the first liner layer. an inter-level dielectric (ILD) layer arranged on the semiconductor substrate and around the epitaxial source/drain regions; and interconnects extending through the ILD layer to over the epitaxial source/drain regions.

In other embodiments, the present disclosure relates to an integrated chip. The integrated chip includes a semiconductor substrate including sidewalls that define a plurality of fins; a dielectric material arranged between the plurality of fins; a gate structure disposed over the dielectric material and around In some embodiments, the integrated chip further includes the plurality of fins; epitaxial source/drain regions disposed along opposing sides of the gate structure and over the plurality of fins the epitaxial source/drain regions having a first sidewall having a first height along a first side of a first fin of the plurality of fins and a second sidewall having a second height over along an opposing second side of the first fin, the first height different than the second height. In some embodiment, the integrated chip further includes a fin spacer completely covering the first sidewall and the second sidewall of the epitaxial source/drain regions. In some embodiment, the epitaxial source/drain regions respectively having a plurality of source/drain segments disposed on the plurality of fins; and a first source/drain segment of the plurality of source/drain segments is arranged directly over the first fin and laterally extends in opposing directions to different distances past opposing sides of the first fin. In some embodiment, the first height is greater than the second height; and the first source/drain segment laterally extend from directly over the first fin to a first distance past the first sidewall and to a second distance past the second sidewall, the second distance larger than the first distance. In some embodiment, the epitaxial source/drain regions respectively include a plurality of segments of a first semiconductor material respectively disposed onto an underlying one of the plurality of fins; and a second semiconductor material disposed over and continuously extending between the plurality of segments of the first semiconductor material. In some embodiment, the second semiconductor material includes a wavy upper surface defining troughs between adjacent ones of the plurality of segments of the first semiconductor material. In some embodiments, the integrated chip further includes an inter-level dielectric (ILD) layer arranged on the semiconductor substrate and around the epitaxial source/drain regions; and an interconnect extending through the ILD layer over a first epitaxial/source drain region of the epitaxial source/drain regions. In some embodiments, the second semiconductor material has a vertically extending sidewall that is arranged along an outermost sidewall of the interconnect.

In other embodiments, the present disclosure relates to a method of forming an integrated chip. The method includes etching a semiconductor substrate to forming sidewalls of the semiconductor substrate that define a plurality of fins; forming a dielectric material between the plurality of fins; forming a gate structure over the dielectric material and around the plurality of fins; forming a fin spacer along sidewalls and an upper surface of the plurality of fins; etching the fin spacer to have a first sidewall with a first height along a first side of a first fin of the plurality of fins and to have a second sidewall with a second height along an opposing second side of the first fin, the first height greater than the second height; and forming epitaxial source/drain regions onto the plurality of fins and between sidewalls of the fin spacer. In some embodiments, the epitaxial source/drain regions respectively include a plurality of source/drain segments respectively disposed onto an underlying one of the plurality of fins; and a doped epitaxial material disposed over and continuously extending between the plurality of source/drain segments. In some embodiments, a first source/drain segment of the plurality of source/drain segments laterally extends from directly over the first fin to a first distance past the first sidewall and to a second distance past the second sidewall, the second distance larger than the first distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a semiconductor substrate comprising sidewalls that define a plurality of fins;
   a dielectric material arranged between the plurality of fins;
   a gate structure disposed over the dielectric material and around the plurality of fins;
   epitaxial source/drain regions disposed along opposing sides of the gate structure and respectively comprising a plurality of source/drain segments disposed on the plurality of fins and a doped epitaxial material disposed onto and between the plurality of source/drain segments; and
   a fin spacer arranged along sidewalls of the plurality of source/drain segments, wherein the fin spacer extends to a first height over the dielectric material along a first sidewall of a first source/drain segment and to a second height over the dielectric material along a second sidewall of a second source/drain segment that faces the first sidewall, the first height being different than the second height.

2. The integrated chip of claim 1, wherein the first source/drain segment of the plurality of source/drain segments laterally extends past an underlying first fin of the plurality of fins in a first direction to a first distance and wherein the first source/drain segment extends past the first fin in a second direction to a second distance that is larger than the first distance, the second direction opposite the first direction.

3. The integrated chip of claim 2, wherein the plurality of fins comprise a second fin that is separated from the first fin along the second direction.

4. The integrated chip of claim 3,
   wherein the plurality of fins comprise a third fin that is separated from the first fin by the second fin; and
   wherein the second source/drain segment of the plurality of source/drain segments laterally extends in the first direction and the second direction to substantially equal distances past opposing sides of the second fin.

5. The integrated chip of claim 1, wherein the plurality of source/drain segments extend to below a bottom of the doped epitaxial material.

6. The integrated chip of claim 1, wherein a first epitaxial source/drain region of the epitaxial source/drain regions wraps around a topmost surface of the fin spacer to a lower surface of the first epitaxial source/drain region that is both vertically below the topmost surface of the fin spacer and along an outer sidewall of the fin spacer that faces the lower surface.

7. The integrated chip of claim 6, wherein the plurality of source/drain segments extend below an upper surface of the fin spacer.

8. The integrated chip of claim 6, wherein the fin spacer comprises a first liner layer and a second liner layer over the first liner layer.

9. The integrated chip of claim 1, further comprising:
an inter-level dielectric (ILD) layer arranged on the semiconductor substrate and around the epitaxial source/drain regions; and
interconnects extending through the ILD layer to over the epitaxial source/drain regions.

10. An integrated chip, comprising:
a semiconductor substrate comprising sidewalls that define a plurality of fins;
a dielectric material arranged between the plurality of fins;
a gate structure disposed over the dielectric material and around the plurality of fins;
epitaxial source/drain regions disposed along opposing sides of the gate structure and over the plurality of fins, wherein the epitaxial source/drain regions comprise a first sidewall having a first height along a first side of a first fin of the plurality of fins and a second sidewall having a second height along a second side of a second fin that faces the first side of the first fin, the first height different than the second height, and wherein the epitaxial source/drain regions respectively comprise a plurality of segments of a first semiconductor material respectively disposed onto an underlying one of the plurality of fins, and a second semiconductor material disposed over and continuously extending between the plurality of segments of the first semiconductor material;
an inter-level dielectric (ILD) layer arranged on the semiconductor substrate and around the epitaxial source/drain regions; and
a conductive interconnect structure extending through the ILD layer over a first epitaxial/source drain region of the epitaxial source/drain regions, wherein the second semiconductor material has a vertically extending sidewall that is arranged along an outermost sidewall of the conductive interconnect structure.

11. The integrated chip of claim 10, further comprising:
a fin spacer completely covering the first sidewall and the second sidewall of the epitaxial source/drain regions.

12. The integrated chip of claim 10,
wherein a first segment of the plurality of segments is arranged directly over the first fin and laterally extends in opposing directions to different distances past opposing sides of the first fin.

13. The integrated chip of claim 10, wherein the second semiconductor material comprises a wavy upper surface defining troughs between adjacent ones of the plurality of segments of the first semiconductor material.

14. An integrated chip, comprising:
a semiconductor substrate comprising opposing sidewalls that form a fin;
a dielectric material arranged along the opposing sidewalls of the semiconductor substrate;
a gate structure disposed over the dielectric material and around the fin;
fin spacers arranged over the dielectric material and on opposing sides of the fin, wherein the fin spacers extend to a first height over the dielectric material along a first side of the fin and to a second height over the dielectric material along an opposing second side of the fin, the first height being different than the second height;
an epitaxial source/drain region disposed on the fin and over the fin spacers, wherein the epitaxial source/drain region extends from directly over the fin spacers to laterally past outermost edges of the fin spacers in opposing directions;
a second epitaxial source/drain region disposed on a second fin formed by second opposing sidewalls of the semiconductor substrate, wherein the gate structure extends around the second fin; and
a doped epitaxial material arranged on the epitaxial source/drain region and the second epitaxial source/drain region, wherein the doped epitaxial material continuously extends from directly over the epitaxial source/drain region, to directly between outermost sidewalls of the epitaxial source/drain region and the second epitaxial source/drain region that face one another, and to directly over the second epitaxial source/drain region.

15. The integrated chip of claim 14, wherein the epitaxial source/drain region is disposed on an upper surface of the fin, the fin spacers having a bottommost surface that is vertically above the upper surface of the fin.

16. The integrated chip of claim 14, wherein a part of the doped epitaxial material that is laterally between the outermost sidewalls of the epitaxial source/drain region and the second epitaxial source/drain region vertically extends from over the epitaxial source drain region to a lower surface of the doped epitaxial material.

17. The integrated chip of claim 16, further comprising:
a cap layer disposed on the doped epitaxial material;
an etch stop layer arranged on the cap layer; and
a silicide extending through the etch stop layer and the cap layer to physically contact the doped epitaxial material, wherein the silicide extends along interior sidewalls of the etch stop layer and the cap layer.

18. The integrated chip of claim 14,
wherein the epitaxial source/drain region is disposed directly over a topmost surface of the fin spacers; and
wherein the epitaxial source/drain region wraps around the topmost surface of the fin spacers to a lower surface of the epitaxial source/drain region that is both vertically below the topmost surface of the fin spacers and along an outer sidewall of the fin spacers that faces away from the fin.

19. The integrated chip of claim 10, wherein the conductive interconnect structure comprises:
a silicide;
a liner over the silicide; and
a conductive material over the liner.

20. The integrated chip of claim 10, wherein the second semiconductor material completely separates neighboring ones of the plurality of segments from one another.

* * * * *